United States Patent
Schroeder

(10) Patent No.: US 12,041,852 B2
(45) Date of Patent: Jul. 16, 2024

(54) SILICON THERMOELECTRIC GENERATOR

(71) Applicant: Jon Murray Schroeder, Leander, TX (US)

(72) Inventor: Jon Murray Schroeder, Leander, TX (US)

(73) Assignee: Juanita Castorena, Leander, TX (US)

( * ) Notice: Subject to any disclaimer, the term of this patent is extended or adjusted under 35 U.S.C. 154(b) by 0 days.

(21) Appl. No.: 18/067,465

(22) Filed: Dec. 16, 2022

(65) Prior Publication Data

US 2024/0206338 A1 Jun. 20, 2024

(51) Int. Cl.
*H10N 10/17* (2023.01)
*H10N 10/855* (2023.01)

(52) U.S. Cl.
CPC ......... *H10N 10/17* (2023.02); *H10N 10/8552* (2023.02)

(58) Field of Classification Search
CPC ............................ H10N 10/17; H10N 10/8552
See application file for complete search history.

(56) References Cited

U.S. PATENT DOCUMENTS

| | | |
|---|---|---|
| 5,393,350 A | 2/1995 | Schroeder |
| 5,597,976 A | 1/1997 | Schroeder |
| 8,101,846 B1 | 1/2012 | Schroeder et al. |
| 8,183,456 B1 | 5/2012 | Schroeder et al. |
| 8,354,582 B2 | 1/2013 | Schroeder et al. |
| 8,598,445 B2 | 12/2013 | Schroeder et al. |
| 8,684,114 B2 | 4/2014 | Schroeder et al. |

(Continued)

FOREIGN PATENT DOCUMENTS

| | | |
|---|---|---|
| DE | 102015107240 | 3/2022 |
| JP | 3815745 B2 | 8/2006 |

(Continued)

OTHER PUBLICATIONS

Schroeder, et al, Schroeder patent notebook (#338), Computer History Museum, accessed Oct. 18, 2022, https://www.computerhistory.org/collections/catalog/102723021.

(Continued)

*Primary Examiner* — Tamir Ayad
(74) *Attorney, Agent, or Firm* — Thompson Patent Law Offices PC

(57) ABSTRACT

Apparatus and associated methods relate to a thermoelectric device having a superconducting generator ring. In an illustrative example, a thermoelectric device may include a differential generator supply and a thermoelectric generator ring. The thermoelectric generator ring, for example, may be configured to generate an electric current based on a differential temperature received from the differential temperature supply. For example, the thermoelectric generator ring may include a number of thermoelectric coupons forming a ring on a horizontal plane. Each of the thermoelectric coupons may include an n-type impurity diffused silicon semiconductor (IDSS) and an p-type IDSS. For example, the impurities may be distributed in the IDSS at a predetermined concentration distribution, at which a forward bias voltage of the IDSS is below a predetermined target voltage (e.g., 20 mV) Various embodiments may advantageously generate a low-voltage loss high electric current based on an applied temperature differential at the thermoelectric coupons.

18 Claims, 12 Drawing Sheets

(56) References Cited

U.S. PATENT DOCUMENTS

| | | |
|---|---|---|
| 8,688,390 B2 | 4/2014 | Schroeder et al. |
| 2003/0217766 A1 | 11/2003 | Schroeder et al. |
| 2004/0134200 A1 | 7/2004 | Schroeder et al. |
| 2009/0007900 A1 | 1/2009 | Leifer et al. |
| 2009/0229650 A1 | 9/2009 | Schroeder et al. |
| 2010/0288322 A1 | 11/2010 | Schroeder et al. |
| 2010/0288323 A1 | 11/2010 | Schroeder et al. |
| 2010/0288326 A1 | 11/2010 | Schroeder et al. |
| 2012/0090534 A1 | 4/2012 | Schroeder et al. |
| 2012/0247847 A1 | 10/2012 | Schroeder et al. |
| 2013/0154375 A1 | 6/2013 | Schroeder et al. |
| 2014/0076826 A1 | 3/2014 | Schroeder et al. |
| 2014/0163714 A1 | 6/2014 | Schroeder et al. |
| 2014/0196274 A1 | 7/2014 | Schroeder et al. |
| 2014/0208773 A1 | 7/2014 | Schroeder et al. |
| 2018/0347406 A1 | 12/2018 | Friesth |
| 2019/0165236 A1 | 5/2019 | Steutermann |
| 2021/0381725 A1 | 12/2021 | Akic |
| 2022/0029081 A1 | 1/2022 | Khvorostianyi et al. |

FOREIGN PATENT DOCUMENTS

| | | |
|---|---|---|
| RU | 2740589 C1 | 1/2021 |
| WO | 1997043790 A1 | 11/1997 |

OTHER PUBLICATIONS

Stockholm, et al, Thermoelectric Generator With an Active Load, Materials Today: Proceedings, Dec. 2015, accessed via ResearchGate, DOI: 10.1016/j.matpr.2015.05.094, 8 pages.

Stockholm, J, High Efficiency Inductive Thermoelectric Generator—Illusion or Reality, Materialy Ceramiczine / Ceramic Materials, 66, 2, (2014), 197-202, received Oct. 27, 2013, 6 pages.

Alexander, T, Improved carrier selectivity of diffused silicon wafer solar cells, UNSW Sydney, 2017, https://unsworks.unsw.edu.au/entities/publication/985fd09e-5a57-4ed9-b855-80ac538d2e94.

Anatychuk, L, Physics of Thermoelectricity, 1998, including private, handwritten notes of inventor, 6 pages.

Elyamny, et al "High Power Thermoelectric Generator Based on Vertical Silicon Nanowires," Nano Lett., vol. 20, No. 7, pp. 4748-4753, Jul. 2020, doi: 10.1021/acs.nanolett.0c00227.

Goldsmid, H, Improving the thermoelectric figure of merit, Science and Technology of Advanced Materials, Apr. 13, 2021, 6 pages.

Grove, A, Physics and Technology of Semiconductor Devices, Jan. 6, 1991, including private, handwritten notes of inventor, 3 pages.

Jaziri, et al, "A comprehensive review of Thermoelectric Generators: Technologies and common applications," Energy Reports, vol. 6, pp. 264-287, Dec. 2020, doi: 10.1016/j.egyr.2019.12.011.

Lu, et al, Electron and phonon drag in thermoelectric transport through coherent molecular conductors, School of Physics and Wuhan National High Magnetic Field Center, Jan. 24, 2016, 10 pages.

Lu, et al, Thermal resistance matching for thermoelectric cooling systems, Energy Conversion and Management, vol. 169, Aug. 1, 2018, pates 189-193.

Neira, J, "this ring turns your body heat into a battery and regenerates itself," designboom | architecture & design magazine, Feb. 12, 2021, retrieved from the internet Oct. 27, 2022, https://www.designboom.com/technology/ring-turns-body-heat-battery-02-12-2021.

Pulse Power Center, U.S. Army Research Laboratory, Aug. 10, 1994, 10 pages.

Quora, "Why does the potential barrier of a diode decrease when it is forward biased?," Quora, retrieved from the Internet Oct. 18, 2022, https://www.quora.com/Why-does-the-potential-barrier-of-a-diode-decrease-when-it-is-forward-biased.

R. Chavez et al., "High Temperature Thermoelectric Device Concept Using Large Area PN Junctions," Journal of Elec Materi, vol. 43, No. 6, pp. 2376-2383, Jun. 2014, doi: 10.1007/s11664-014-3073-x.

Schroeder, J "A New Thermoelectric Generator for Rural Electrification," The Trymer Company, available: http://www.rexresearch.com/SchroederTherlx/14377.pdf, (no date).

Stabler, F, "Automotive Thermoelectric Generator Design Issues," p. 26, Future Tech, TTC, http://www.rexresearch.com/SchroederTherlx/stabler.pdf, (no date).

Stockholm, et al, "Thermoelectric Generator with an Active Load," Materials Today: Proceedings, vol. 2, No. 2, pp. 744-750, Jan. 2015, doi: 10.1016/j.matpr.2015.05.094.

Stockholm, J "Non-Stationary Thermoelectric Generators," in Thermoelectrics for Power Generation—A Look at Trends in the Technology, S. Skipidarov and M. Nikitin, Eds. InTech, 2016. doi: 10.5772/66421.

Stockholm, J, , "High efficiency inductive thermoelectric generator—illusion or reality," Materialy Ceramiczne, No. T. 66, hr 2, pp. 197-202, 2014.

NSF Award # 9561696—SBIR Phase I: A Themoelectric Generator Used as an Energy Store for Grid Leveling., assessed on Oct. 19, 2022, https://www.nsf.gov/awardsearch/showAward?AWD_ID=9561696.

SBIR.gov, A Liquid Fuel Pocket-Sized Thermoelectric Generator for Battery Replacement, Award Information, Department of Defense, 1996, accessed, Oct. 19, 2022, https://www.sbir.gov/sbirsearch/detail/339542.

SILICON THERMOELECTRIC GENERATOR

CROSS-REFERENCE TO RELATED APPLICATIONS

The subject matter of this application may have common inventorship with and/or may be related to the subject matter of the following:

U.S. application Ser. No. 10/154,757, titled "Torus semiconductor thermoelectric device," filed by Jon Schroeder, et al., on May 23, 2002.

U.S. application Ser. No. 10/340,885, titled "Torus semiconductor thermoelectric chiller," filed by Jon Schroeder, et al., on Jan. 13, 2003.

U.S. application Ser. No. 11/259,922, titled "Solid state thermoelectric power converter," filed by Jon Murray Schroeder, et al., on Oct. 28, 2005, issued as U.S. Pat. No. 8,101,846.

U.S. application Ser. No. 11/517,882, titled "Thermoelectric device with make-before-break high frequency converter," filed by Jon Murray Schroeder, et al., on Sep. 8, 2006, issued as U.S. Pat. No. 8,183,456.

U.S. application Ser. No. 12/454,378, titled "Solar home electrification with grid connection," filed by Jon Murray Schroeder, et al., on May 18, 2009, issued as U.S. Pat. No. 8,354,582.

U.S. application Ser. No. 12/454,379, titled "Solar thermoelectric power station," filed by Jon Murray Schroeder, et al., on May 18, 2009.

U.S. application Ser. No. 12/454,376, titled "Solar to electric system," filed by Jon Murray Schroeder, et al., on Sep. 18, 2009.

U.S. application Ser. No. 14/179,549, titled "Thermoelectric evaluation and manufacturing methods," filed by Jon Murray Schroeder, et al., on Feb. 12, 2014.

This application incorporates the entire contents of the foregoing application(s) herein by reference.

TECHNICAL FIELD

Various embodiments relate generally to methods and systems related to thermoelectric generators.

BACKGROUND

Seebeck effect is a production of an electromotive force that develops across two points of an electrically conducting material when there is a temperature difference between them. For example, an electric current may be generated in a loop of material consisting of at least two dissimilar conductors when two junctions are maintained at different temperatures. The conductors, for example, may be metals. In some examples, the Seebeck effect may also occur at a junction of two semiconductors. In some examples, the conductors need not be solids. A Seebeck coefficient of a material is a measure of magnitude of an induced thermoelectric voltage in response to a temperature difference across that material. Accordingly, electric power may be generated at a junction when a thermal energy differential is applied at the junction.

Thermoelectricity may include a conversion of heat into electricity or electricity into heat. The absorption or release of heat at a junction of two materials in which there is an electric current is called the Peltier effect. Both the Seebeck and Peltier effects may occur at the junction between a metal and a semiconductor and at the junction between two semiconductors. For example, the development of semiconductor thermocouples (e.g., those consisting of n-type and p-type bismuth telluride) has made the use of the Peltier effect practical for low demand refrigeration applications.

For example, when an electric current is made to flow at two junctions, a temperature difference may be developed between the junctions. If a temperature of a hotter junction is kept low by removing heat, for example, the second junction may be tens of degrees colder than the hotter junction to act as a refrigerator. Peltier refrigerators may, for example, be used to cool small bodies because they are compact without moving mechanical parts. In some examples, Peltier refrigerators may be regulated to maintain precise and stable temperatures.

SUMMARY

Apparatus and associated methods relate to a thermoelectric device having a superconducting generator ring. In an illustrative example, a thermoelectric device may include a differential generator supply and a thermoelectric generator ring. The thermoelectric generator ring, for example, may be configured to generate an electric current based on a differential temperature received from the differential temperature supply. For example, the thermoelectric generator ring may include a number of thermoelectric coupons forming a ring on a horizontal plane. Each of the thermoelectric coupons may include an n-type impurity diffused silicon semiconductor (IDSS) and a p-type IDSS. For example, the impurities may be distributed in the IDSS at a predetermined concentration distribution, at which a forward bias voltage of the IDSS is below a predetermined target voltage (e.g., 20 mV) Various embodiments may advantageously generate a low-voltage loss high electric current based on an applied temperature differential at the thermoelectric coupons.

Various embodiments may achieve one or more advantages. For example, some embodiments may advantageously rectify the generated current into a power grid compatible power. For example, some embodiments may advantageously be transportable by land, air, and/or sea to provide a mobile power supply. Some embodiments may, for example, advantageously convert salt water into freshwater. Some embodiments may, for example, advantageously receive sea water and carbon input to generate jet fuel.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, to help introduce discussion of various embodiments, a thermoelectric power system is introduced with reference to FIGS. 1-2. Second, that introduction leads into a description with reference to FIGS. 3A-3E of some exemplary embodiments of impurities diffused silicon semiconductors. Third, with reference to FIGS. 4-5, this disclosure turns to a review of experimental data and a discussion of forward bias voltage of a silicon semiconductor and solid solubility of impurities. Fourth, with reference to FIGS. 6-7, this document describes exemplary apparatus and methods useful for producing current generation coupons useful for electric power generation. Fifth, the discussion turns to exemplary embodiments that illustrate exemplary applications of the thermoelectric power system. Finally, the document discusses further embodiments, exemplary applications and aspects relating to low voltage loss (e.g., voltage loss <0.1V) solid state power generation systems.

Figure 1:
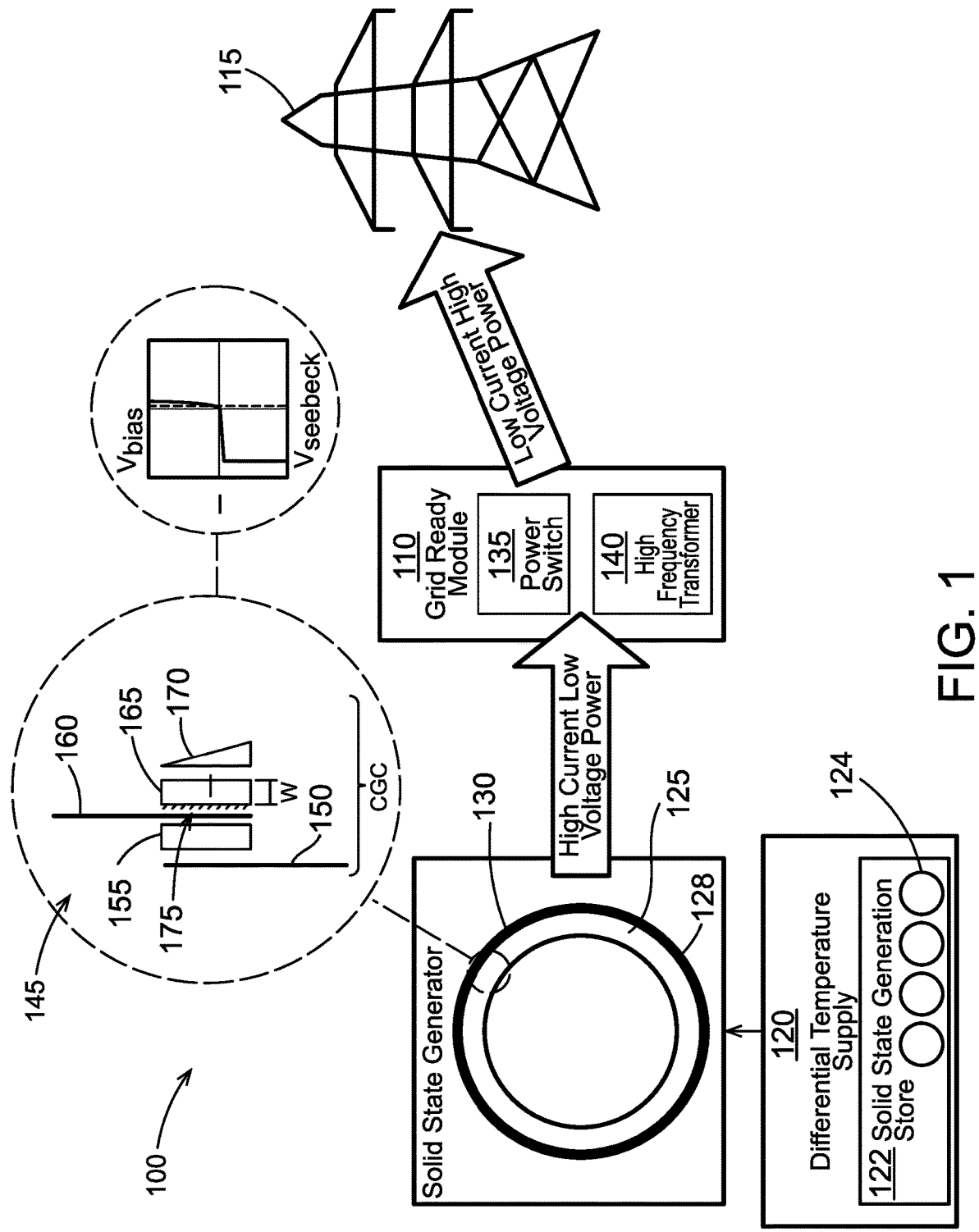
FIG. 1 depicts an exemplary solid state generator (SSG) employed in an illustrative use-case scenario.

FIG. 1 depicts an exemplary solid-state generator (SSG) employed in an illustrative use-case scenario. In this scenario 100, a SSG 105 is connected to a grid ready module 110. The SSG 105 may generate a high current low voltage DC power to the grid ready module 110. For example, the generated DC power may have a voltage of less than 0.1V. For example, the generated DC power may have a voltage less than 0.05V. As shown, the grid ready module 110 converts the high current low voltage DC power to a high voltage low current AC power to supply a power grid 115. For example, the power grid 115 may be a power transmission system supplying electric power to a region (e.g., a city, an island, a state). For example, the high voltage AC power may be 200-240V. For example, the high voltage AC power may be 200-240V. For example, the high voltage AC power may be 100-120V. For example, the high voltage AC power may be 50 kV to 800 kV. For example, the high voltage AC power may be single phase. For example, the high voltage AC power may be three-phased.

As shown, the SSG 105 is operably coupled to a differential temperature supply (DTS 120). For example, the DTS 120 may include a heat source to generate a temperature differential to the SSG 105. In some implementations, the heat source may include a renewable energy source. For example, the heat source may include generating heat using solar energy. For example, the heat source may include transferring heat to the SSG 105 using a thermal energy storage device as described further with reference to FIG. 8. Various embodiments and applications of the SSG 105 are described in Inventor's previously filed U.S. patent application Ser. No. 11/517,882, titled "Thermoelectric device with make-before-break high frequency converter," filed by Jon Murray Schroeder, et al., on Sep. 8, 2006, issued as U.S. Pat. No. 8,183,456. The foregoing application is entirely incorporated herein by reference.

The SSG 105 includes a thermoelectric split ring (TESR 125) enclosed in a ring housing 130. In some implementations, the TESR 125 may induce a high electric current upon receiving a differential temperature supplied from the DTS 120. For example, the TESR 125 may produce 1000-1 million amps of current based on the temperature differential.

In some implementations, the DTS 120 may include a solid-state generation store (SSGS 122). For example, the SSGS 122 may include (electrically) heated insulated bauxite. In some implementations, the DTS 120 may include a fluid circulating system that recirculates hot air produced from the SSGS 122 as a working fluid. In this example, the SSGS 122 includes storage materials 124 (e.g., bauxite alumina rocks) to store thermal energy. In some implementations, the SSGS 122 may include an insulated wall to maintain the thermal energy kept in the storage materials 124.

The grid ready module 110 includes a power switch 135 and a high frequency transformer 140. In some implementations, the power switch 135 may be configured to control the generated current in the TESR 125. For example, the power switch 135 may include a series inductance to control the generated current. In various implementations, the power switch 135 may include enough impedance to advantageously limit the generated current to prevent a Lorentz force breaking apart the TESR 125. In this example, the SSG 105 includes a strap 128 to reinforce a mechanical structure of the TESR 125.

In some implementations, the power switch 135 may switch the generated current (e.g., by opening and shorting the TESR 125) through two, one turn primary windings at 200 kHz to generate a high frequency, low voltage input to the high frequency transformer 140. For example, the high frequency transformer 140 may be a step-up transformer transforming the high current low voltage power to the low current high voltage power. In some implementations, the high frequency transformer 140 may include a pulse-width-modulation (PWM) rectifier to convert the low current high voltage input power to be compatible with the power grid 115 in voltage, frequency, and phase. For example, the PWM rectifier may modulate a square wave DC input power into a sine wave. For example, an output of the PWM rectifier may advantageously be connected to the power grid 115 in-frequency to add power to a, for example, grid transformer.

In some implementations, the high frequency transformer 140 may be a Ferrite high frequency transformer.

In some implementations, the high frequency transformer 140 may include more turns on a secondary coil than a primary coil. For example, the primary coil may include one turn of copper wire. For example, the secondary coil may include 28 turns of copper wire.

For example, the primary coil may include a minimal inductance. For example, the high frequency transformer 140 may receive a (near) square-wave of current on the primary coil without blowing the power switch 135. In some implementations, on the secondary coil, the high frequency transformer 140 may generate a high voltage output based on a step-up turn ratio. For example, a current generated at the secondary coil may decrease from the primary coil by the step-up turn ratio.

In this example, the TESR 125 includes more than one current generation coupon (CGC 145). For example, the TESR 125 may include sixty CGC 145. In other examples, more or less CGC 145 (e.g., 40, 70, 90, 120) may be included in the TESR 125. For example, the CGC 145 may be surrounded and reinforced by a strap to advantageously maintain the structure when the TESR 125 expand when the CGCs 145 of the TESR 125 are heated up by the DTS 120. The CGC 145 includes a cold metal fin 150, a p-silicon solid wafer 155, a hot metal fin 160, and an n-silicon solid wafer 165. A neutral wedge 170 is included in each of the CGC 145 to align the CGC 145 into a ring shape. In some implementations, the neutral wedge 170 and the cold metal fin 150 may be combined. For example, the cold metal fin 150 may be shaped to facilitate formation of a split ring.

The hot metal fin 160, for example, may be coupled to the heat source of the DTS 120 to conduct high temperature to the p-silicon solid wafer 155. In some implementations, the hot metal fin 160 may be coupled to a boiler to receive heat energy. For example, the cold metal fin 150 may be coupled to a chilling source of the DTS 120 to remove high temperature to CGCs 145. In some implementations, the cold metal fins 150 may be air cooled to 55° C.

In some implementations, the p-silicon solid wafer 155 and the n-silicon solid wafer 165 may be a silicon wafer with a manipulated forward bias voltage based on an effective amount of impurities diffusion in the wafers. For example, forward bias voltages ($V_{bias}$) of the p-silicon solid wafer 155 and the n-silicon solid wafer 165 may be reduced to a level less than a Seebeck voltage. ($V_{seebeck}$). Accordingly, the CGC 145 may advantageously include extremely low resistance to a circulating current when heat is received at the hot metal fin 160.

As shown in this example, the n-silicon solid wafer 165 may include a contact surface 175 configured to contact the hot metal fin 160. For example, a ratio of a surface area (of the contact surface 175) to a width (w) of the n-silicon solid wafer 165 may be high (e.g., higher than 1:20, 1:50, 1:100, 1:200). For example, the high surface area to width ratio may advantageously increase current induction efficiency.

In some implementations, the SSG 105 may be operated as a 1-MW solid state, 3 phase 50/60 Hz generator. For example, the SSG 105 may be operated using low carbon waste heat as described in further details with reference to FIG. 8. For example, the CGC 145 made with silicon wafers may advantageously be resilient to make the SSG 105 suitable for transportation.

Figure 2:
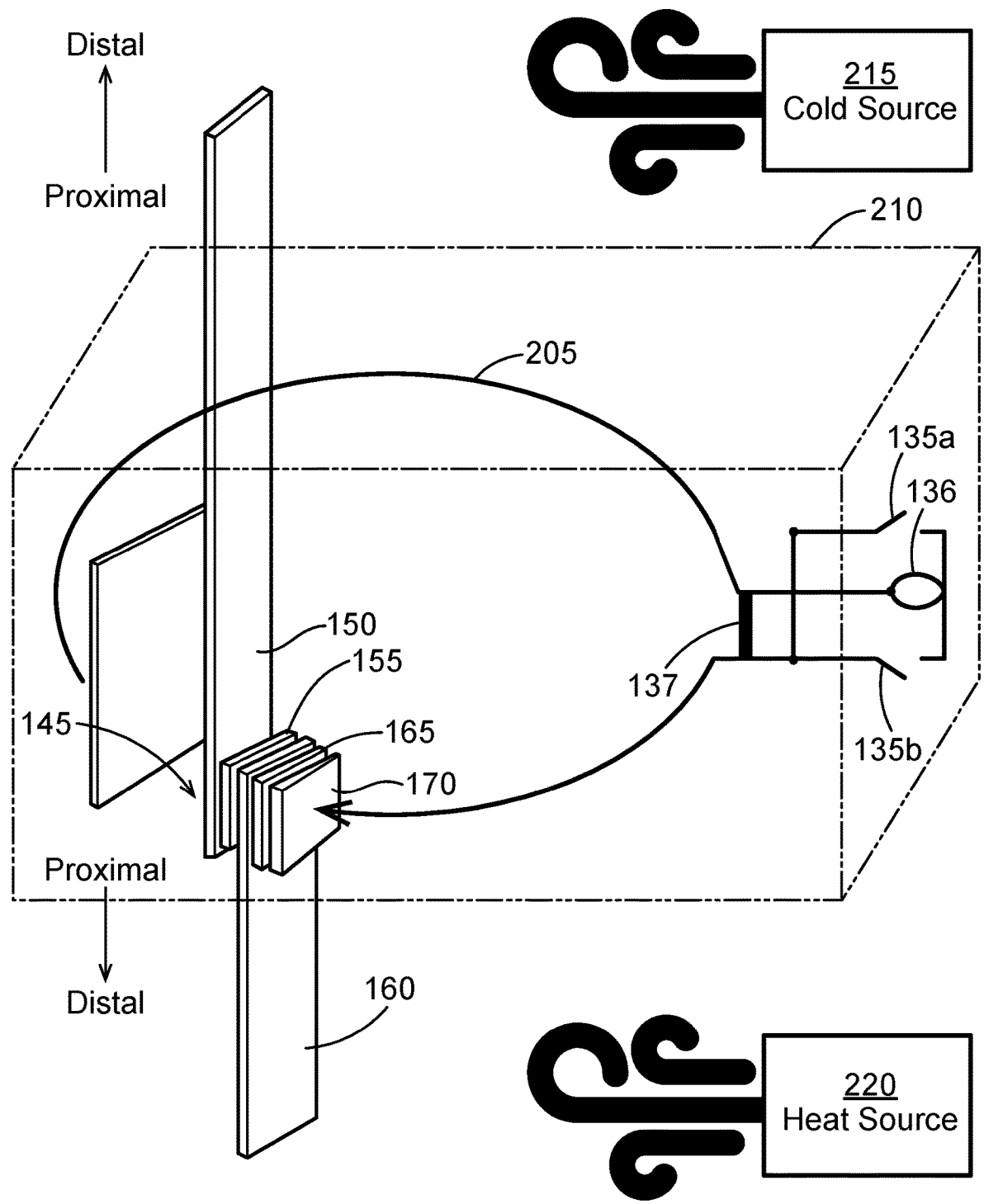
FIG. 2 is a block diagram depicting an exemplary thermoelectric generator ring with a closed up view in an exemplary current generation coupon.

FIG. 2 is a block diagram depicting an exemplary thermoelectric generator split ring with a closed up view in an exemplary current generation coupon. In this example, multiple CGCs 145 are arranged to form a split ring 205 on a horizontal plane. The split ring 205 is enclosed in a housing 210. As shown, each CGC 145 includes a hot metal fin 160 and a cold metal fin 150 that extends orthogonal to the horizontal plane. In some implementations, the cold metal fin 150 and the hot metal fin 160 may extend 1800 with each other. As shown, the cold metal fin 150 is extended upwards to receive cold fluid from a cold source 215. For example, the hot metal fin 160 is extended downwards to receive hot fluid from a heat source 220.

In some implementations, each CGC 145 may include impurities diffused silicon semiconductors (IDSS). For example, the CGC 145 may include P+ impurities in the p-silicon solid wafer 155 and n-impurities in the n-silicon solid wafer 165. In various implementations, when a temperature differential is applied in a forward direction (e.g., with higher temperature at the hot metal fin 160 and cooler temperature at the cold metal fin 150), the IDSS of the CGC 145 may induce a current flow. In some embodiments, the IDSS may be configured to include a close to zero resistance such that each of the CGC 145 may be superconducting. For example, the diffused silicon semiconductor (IDSS) may include impurities at a predetermined concentration distribution, such that a forward bias voltage of the IDSS is below a predetermined voltage. By combining a number of CGC 145, each feeding an induced electric current in a split ring, for example, the SSG 105 may generate a super high electric current (e.g., 8000 A).

As depicted, the power switch 135 includes a first terminal 135a and a second terminal 135b, each connected to a second coil 136. As depicted, the power switch 135 alternately connects a first lead of the SSG 105 to the second coil 136 through either the first terminal 135a or the second terminal 135b. A second lead of the SSG 105 is connected to a common terminal of the second coil 136. Accordingly, the sequential connection of the first lead of the SSG 105 to the power switch 135 through the first terminal 135a and the second terminal 135b may advantageously convert a single direction of current flow in the SSG 105 to alternating current through the second coil 136. Accordingly, by way of example and not limitation, the SSG 105 may advantageously be controlled to output alternating current at a predetermined frequency (e.g., 50 Hz, 60 Hz).

In this example, the split ring 205 may be connected by a thermally conducting electrical insulator 137. For example, the thermally conducting electrical insulator 137 may include a mica. For example, the thermally conducting electrical insulator 137 may include 1 inch square surfaces coupled to each end of the split ring 205. For example, the thermally conducting electrical insulator 137 may be 0.05" thick. In some implementations, the thermally conducting electrical insulator 137 may force the electric current generated in the split ring to the second coil 136 of the high frequency transformer 140.

In various implementations, the high frequency transformer 140 may include two, one-turn coils. Some exemplary embodiments of connections between the split ring 205 and the high frequency transformer 140 are discussed with reference to FIGS. 5 and 9 the Inventor's own U.S. Patent Application Serial No. U.S. Ser. No. 14/229,838, titled "Thermoelectric device with make-before-break high frequency converter," filed by Jon Murray Schroeder, et al., on Mar. 29, 2014. The foregoing application is entirely incorporated herein by reference.

Figure 3A:
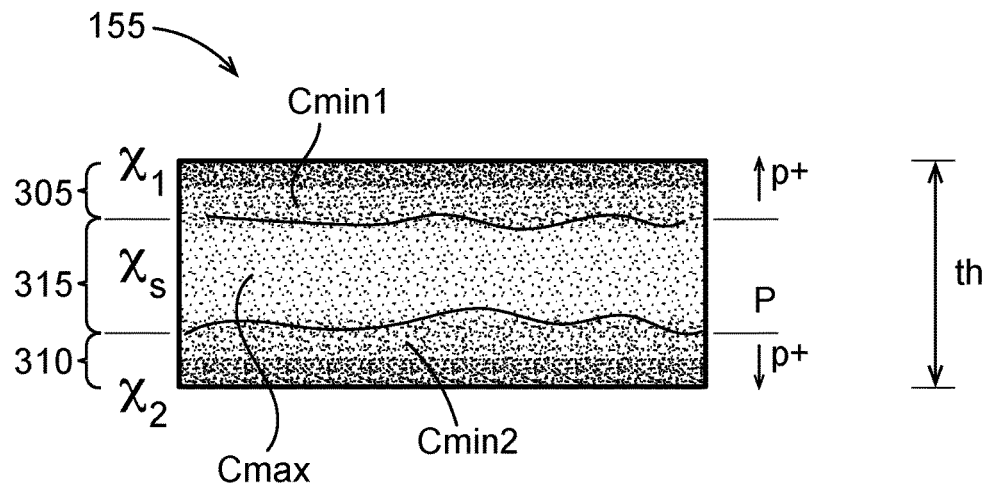
FIG. 3A, FIG. 3B, and FIG. 3C depict an exemplary structure, carrier concentration, thermal resistance, and electron mobility of an exemplary p-type semiconductor of the current generation coupon as described with reference to FIG. 2.
Figure 3B:
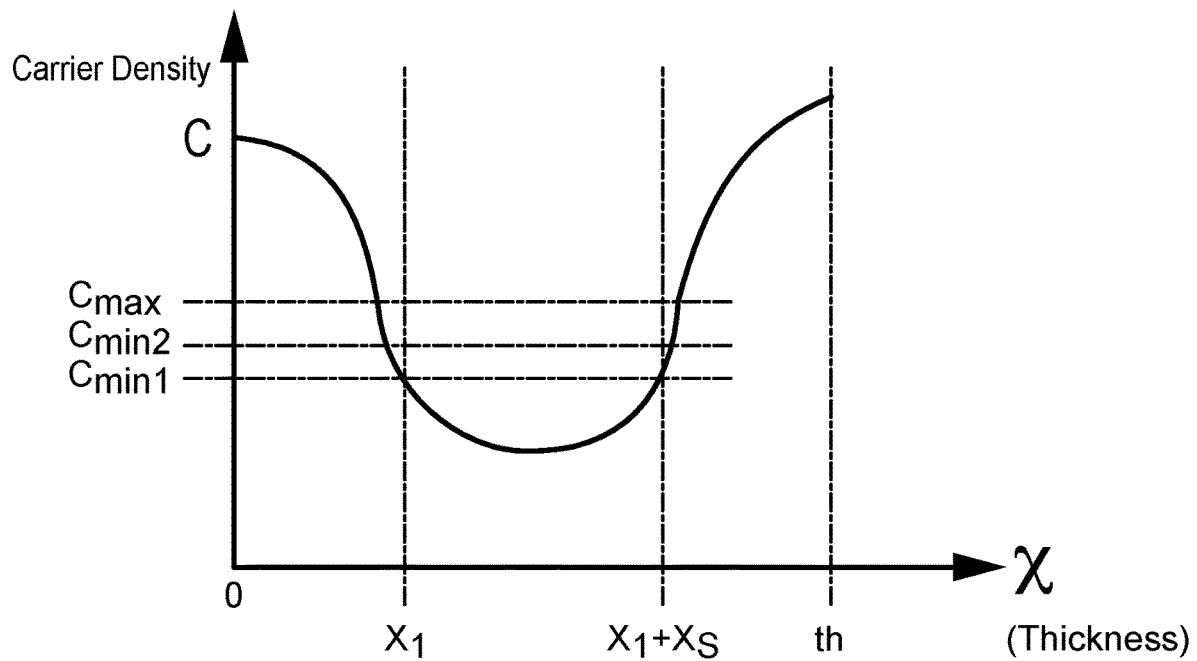
Figure 3C:
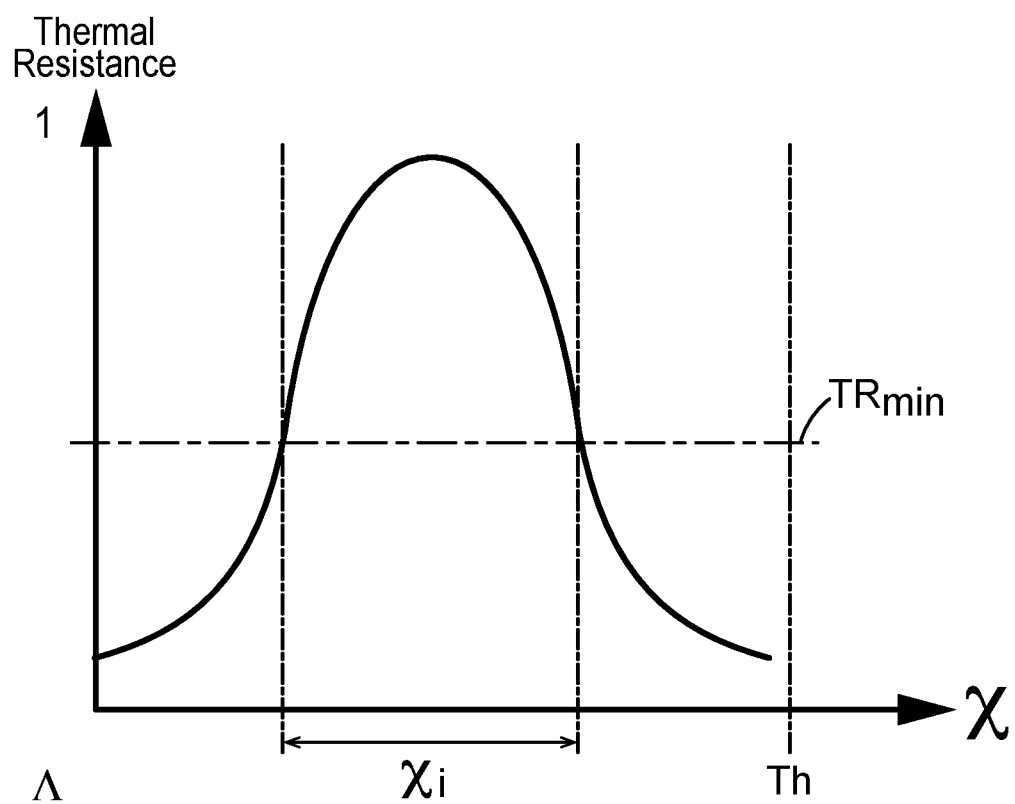

FIG. 3A, FIG. 3B, and FIG. 3C depict an exemplary structure, carrier concentration, thermal resistance, and electron mobility of an exemplary p-type silicon wafer of the current generation coupon (CGC 145) as described with reference to FIG. 2. As shown in FIG. 3A, a p-silicon solid wafer 155, having a total thickness (th), includes an entrance layer 305, an exit layer 310, and a p-type substrate 315. For example, the total thickness may be 1200-1600 microns. The entrance layer 305 has a thickness of $X_1$. The exit layer 310 has a thickness of $X_2$. The p-type substrate 315 has a thickness of Xs. Some exemplary thickness of $X_1$ and $X_2$ are described with reference to FIG. 5.

As an illustrative example, th may be 1400 microns. By way of example and not limitation, $X_1$ may be 10 microns. $X_2$ may, for example, be 10 microns. For example, Xs may be 1380 microns.

The entrance layer 305 includes p+ carriers with a concentration of at least more than a predetermined concentration $C_{min1}$. The exit layer 310 includes p+ carriers with a concentration of at least more than a predetermined concentration $C_{min2}$. The p-type substrate 315 includes p+ carriers with a concentration no more than a predetermined concentration $C_{max}$. In various examples, the p-type substrate 315 may include nearly no p+ carriers.

As shown, the p-silicon solid wafer 155 includes a p+-p junction in the entry region and a p-p+ junction in the exit region. The n-silicon solid wafer 165 includes a n+-n junction in the entry region and a n-n+ junction in the exit region.

As shown in FIG. 3B, the $C_{min2} > C_{max}$ and $C_{min1} > C_{max}$. In various implementations, the predetermined concentrations $C_{min1}$ and $C_{min2}$ may advantageously reduce the forward bias voltage of the p-silicon solid wafer 155.

In various implementations, the p-silicon solid wafer 155 may be coupled to the cold metal fin 150 at the entrance layer 305 and the hot metal fin 160 at the exit layer 310. In operation, for example, a temperature differential may be applied (e.g., by the DTS 120) between the entrance layer 305 and the exit layer 310 to induce an electric current to flow into the entrance layer 305 and out of the exit layer 310. As shown in FIG. 3C, the p-type substrate 315 may include a thermal resistance above a predetermined minimum level ($T_{Rmin}$) to advantageously generate a heat flow (e.g., a temperature differential) between two sides of the p-silicon solid wafer 155 to generate electric current.

Figure 3D:
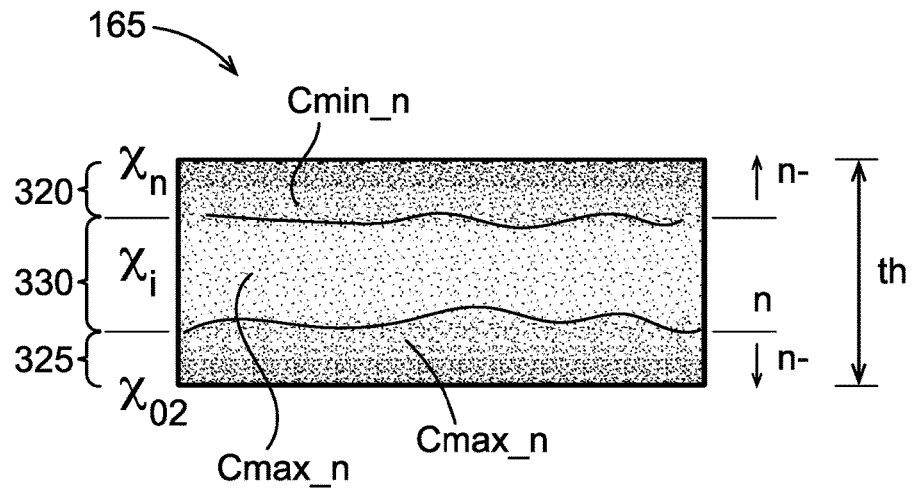
FIG. 3D and FIG. 3E depict an exemplary structure and carrier concentration of an exemplary n-type semiconductor of the current generation coupon as described with reference to FIG. 2.
Figure 3E:
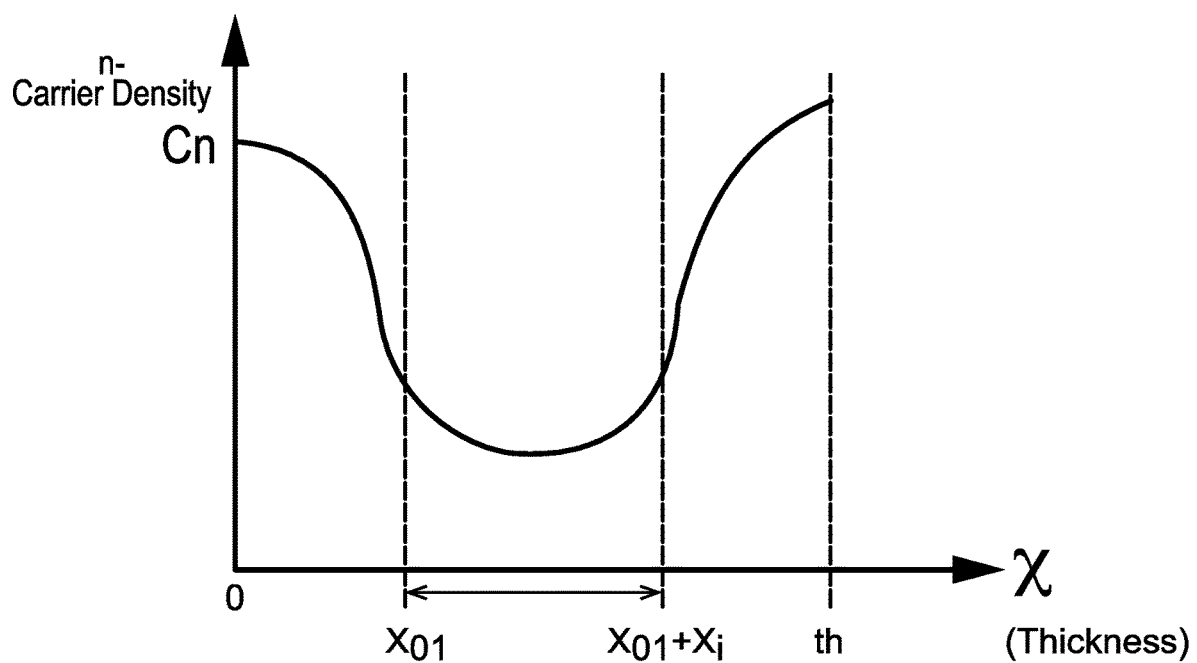

FIG. 3D and FIG. 3E depict an exemplary structure and carrier concentration of an exemplary n-type semiconductor of the current generation coupon as described with reference to FIG. 2. As shown in FIG. 3D, the n-silicon solid wafer 165 includes an entrance layer 320, an exit layer 325, and a n-type substrate 330. The entrance layer 320 has a thickness of $X_{1n}$. The exit layer 325 has a thickness of $X_{2n}$. The p-type substrate 330 has a thickness of $X_{sn}$.

As an illustrative example, th may be 1400 microns. By way of example and not limitation, $X_{1n}$ may be 10 microns. $X_{2n}$ may, for example, be 10 microns. For example, $X_{Sn}$ may be 1380 microns.

Similar to the p-silicon solid wafer 155 as described with reference to FIGS. 3A-B. The entrance layer 320 includes n− carriers with a concentration of at least more than a predetermined concentration $C_{min1\_n}$. The exit layer 325 includes n− carriers with a concentration of at least more than a predetermined concentration $C_{min2\_n}$. The n-type substrate 330 includes n− carriers with a concentration no more than a predetermined concentration $C_{max\_n}$. In various examples, the n-type substrate 330 may include nearly no n− carriers.

As shown in FIG. 3E, the $C_{min2\_n} > C_{max\_n}$ and $C_{min1\_n} > C_{max\_n}$. In various implementations, the predetermined concentrations $C_{min1\_n}$ and $C_{min2\_n}$ may advantageously reduce the forward bias voltage of the p-silicon solid wafer 155. As described in FIG. 2, the n-silicon solid wafer 165 may be coupled to the cold metal fin 150 at the exit layer 325 and the hot metal fin 160 at the entrance layer 305. Accordingly, in an illustrative example, in the TESR 125, the DTS 120 may supply a heat flow in one direction through the p-silicon solid wafer 155 and in an opposite direction through the n-silicon solid wafer 165. As such, for example, a super high electric current may be induced to flow around the TESR 125 by aggregating the electric current induced at each of the CGC 145 in the TESR 125.

Figure 4:
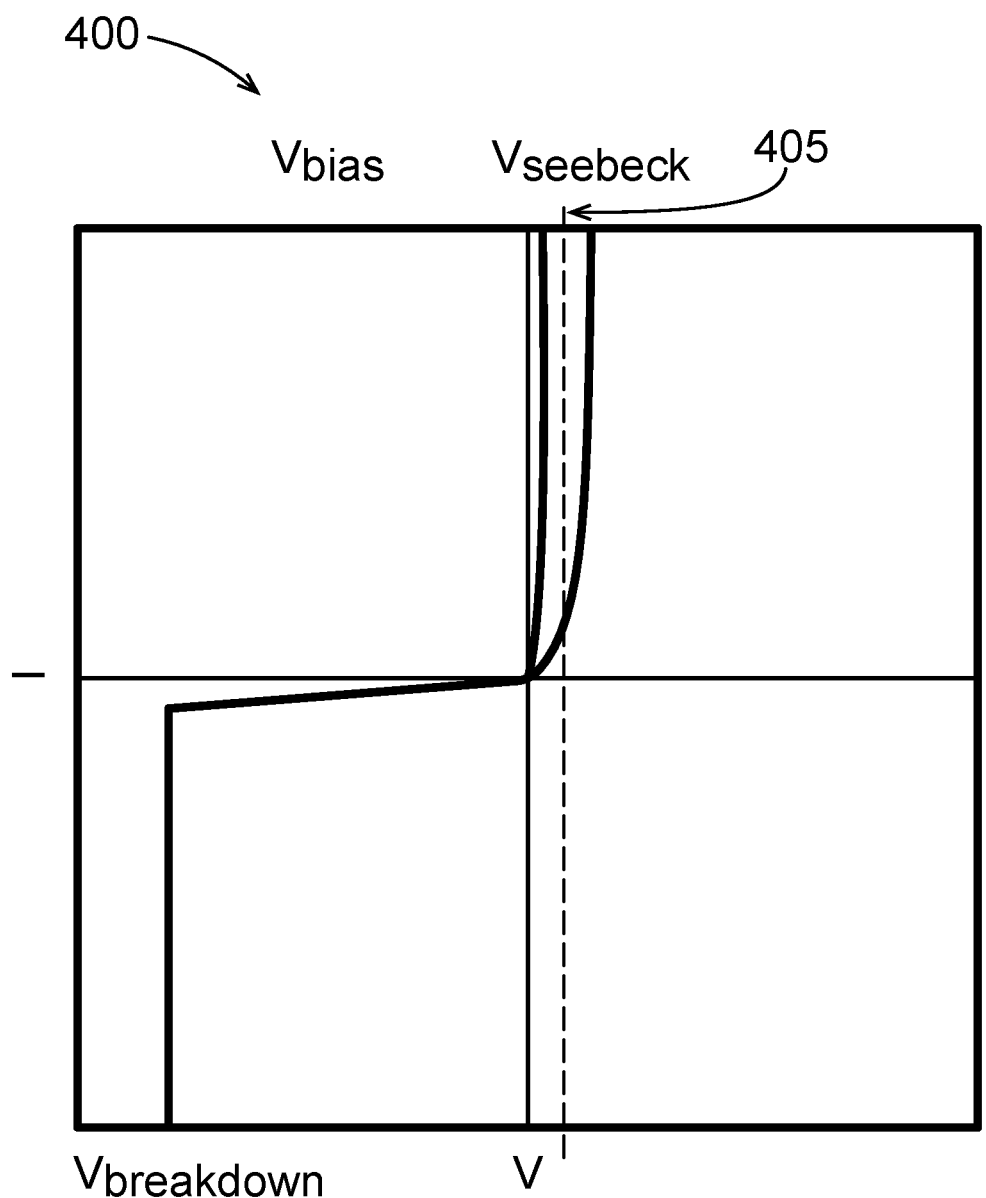
FIG. 4 shows an exemplary transfer characteristic of an exemplary p-type solid wafer as described with reference to FIGS. 3A-3C.

FIG. 4 shows an exemplary transfer characteristic 400 of an exemplary p-type solid wafer as described with reference to FIGS. 3A-3C. In this example, a voltage applied between the entrance layer 305 and the exit layer 310 is represented by a horizontal axis. A current corresponding to the applied voltage is represented by a vertical axis. As shown, when a negative voltage above a breakdown voltage ($V_{breakdown}$) is applied between the entrance layer 305 and the exit layer 310, the p-silicon solid wafer 155 is not conducting so that no current is flowing at the p-silicon solid wafer 155. For example, $V_{breakdown}$ may be −60V to −800V. When the applied voltage increases to a positive voltage, above the forward bias voltage ($V_{bias}$), a current begins to flow.

In some implementations, the TESR 125 may induce a current with a voltage applied between the entrance layer 305 and the exit layer 310 at around a seebeck voltage ($V_{seeback}$). As shown, $V_{bias} < V_{seebeck}$. For example, $V_{bais}$ may be reduced to close to zero (e.g., less than 0.02V). As such, the CGC 145 that includes a p-silicon solid wafer 155 and a n-silicon solid wafer 165 may include near-zero resistance when a temperature differential is introduced in the forward direction such that an electric current is induced by the CGC 145. In some implementations, when multiple CGCs 145 are combined to form the TESR 125 so that each CGC 145 may feed the induced electric current to an adjacent CGC 145, the TESR 125 formed may become superconducting. Some exemplary embodiments of a high efficiency conversion of heat energy to electrical energy using a ring of metallic components are discussed in the Inventor's own U.S. patent application Ser. No. 11/259,922, titled "Solid state thermoelectric power converter," filed by Jon Murray Schroeder, et al., on Oct. 28, 2005, issued as U.S. Pat. No. 8,101,846. The foregoing application is entirely incorporated herein by reference.

In some examples, $V_{bias}$ may be controlled by controlling a carrier concentration at the entrance layer 305 and the exit layer 310. In various implementations, carriers may be introduced to the entrance layer 305 and the exit layer 310 using a diffusion step as described with reference to FIGS. 6-7. As an illustrative example without limitation, $V_{bias}$ of the p-silicon solid wafer 155 may be reduced by the diffusion step as shown by an arrow 405.

In various implementations, the concentration and depth (e,g., $X_1$, $X_2$, $X_{1n}$, $X_{2n}$) may be determined by parameters applied to a solid wafer at the diffusion step. In some examples, a carrier (e.g., impurities) for doping may be selected. Based on the carrier selected, a manufacturing process may include parameters (e.g., including a deposition temperature, a diffusion time for the carriers at the diffusion step) to achieve a target forward bias voltage at the entrance layer 305 and the exit layer 310, for example.

Figure 5:
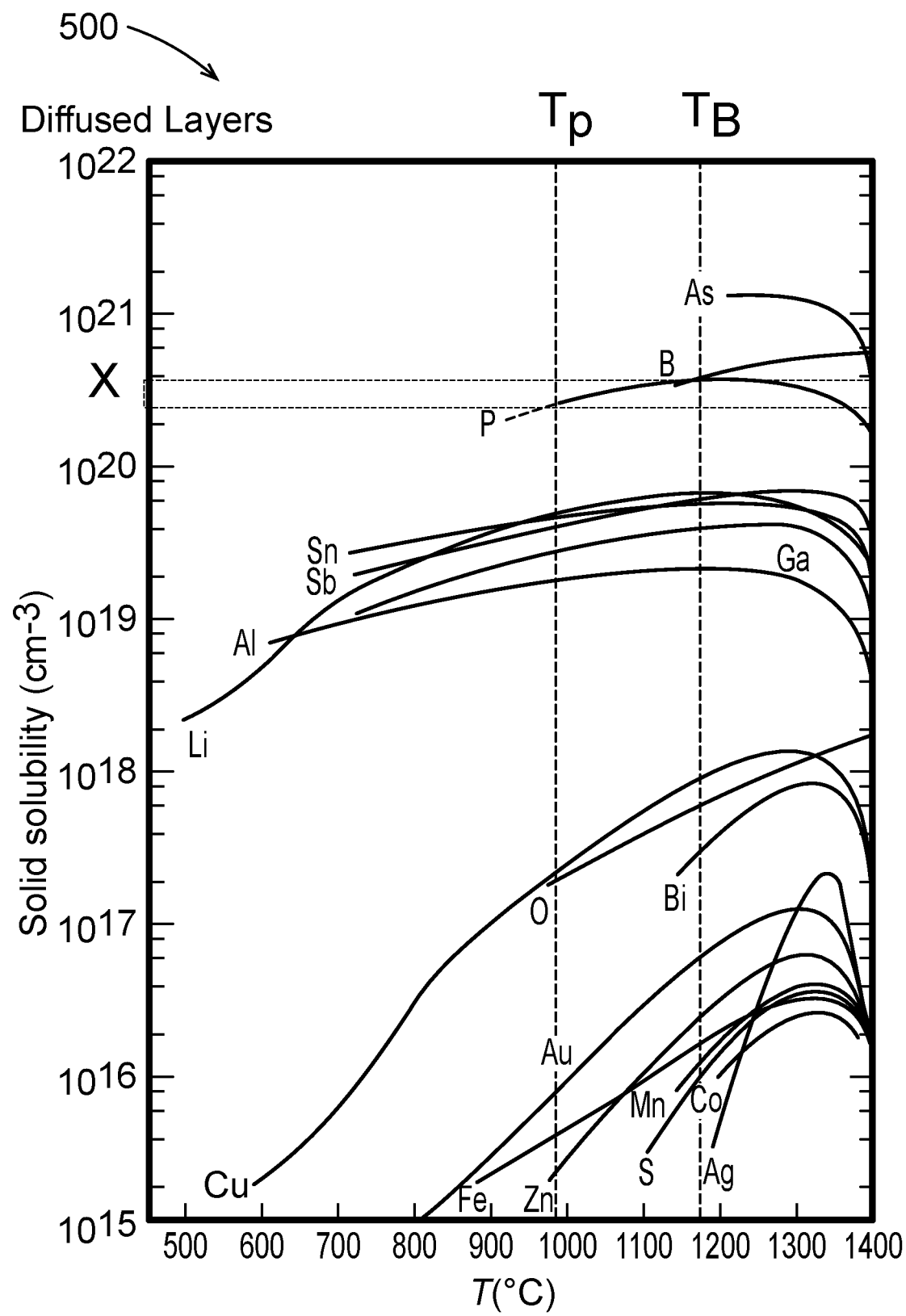
FIG. 5 shows exemplary deposition temperature selections based on solid solubility of a selected carrier.

FIG. 5 shows exemplary deposition temperature selections based on solid solubility of a selected carrier. For example, p-type impurity may be diffused into both front and back surfaces (e.g., the entrance layer 305 and the exit layer 310) of a p-silicon solid wafer 155 to significantly reduce a normally induced 0.4V forward bias voltage. For example, the n-type impurity may be diffused into both front and back surfaces (e.g., the entrance layer 320 and the exit layer 325) of a n-silicon solid wafer 165 to significantly reduce a normally induced 0.4V forward bias voltage.

In some implementations, a solid-state diffusion process may be used to form diffused layers of impurities in the p-silicon solid wafer 155 and the n-silicon solid wafer 165. For example, the diffused layer may be formed in the p-silicon solid wafer 155 and the n-silicon solid wafer 165 in a two step process. In a predeposition step, impurities may, for example, be introduced to a semiconductor wafer to a depth of a few microns. Once the impurities are introduced, in a diffusion step, the impurities may be forced to diffused deeper into the wafer to provide a suitable concentration distribution (e.g., the $C_{min1}$, $C_{min2}$, $C_{min1\_n}$, $C_{min2\_n}$ as described with reference to FIGS. 3A-3E), for example.

In some implementations, the predeposition step may be performed by placing the wafer in a carrier acid (e.g., boric acid, phosphoric acid) for a predetermined time. Next, for example, in the diffusion step, carrier deposited wafer may be placed in a diffusion furnace. For example, boron doped wafers may be diffused in a p-type furnace. For example, phosphorus doped wafers may be diffused in a separate n-type furnace. In some examples, using separate p-type and n-type furnaces may advantageously improve reliability of the resulting p-silicon solid wafer 155 and n-silicon solid wafer 165.

In some implementations, the diffusion furnace may be configured to heat the carrier deposited wafer to a first predetermined temperature $T_1$ for a first predetermined time $t_1$ (e.g., 10 minutes). For example, the first predetermined temperature may be between 800° C. to 1200° C. Next, in some implementations, the carrier deposited wafer may be allowed to cool to a second predetermined temperature $T_2$ for a second predetermined time $t_2$ in the diffusion furnace.

As an illustrative example, at a present process, boron may be selected to diffuse into the p-silicon solid wafer 155. For example, a range of depth of X, as shown in the graph 500, may be determined based on a minimum concentration required to reduce the forward bias voltage of the p-silicon solid wafer 155 to a near zero $V_{bais}$ as described with reference to FIG. 4. As shown in a solubility graph 500, solid solubility of the p-type boron (B) with respect to temperature is shown. In this example, at $T_B$, boron may include a solid solubility that allows it to diffuse to the predetermined range of depth X. Accordingly, for example, the first predetermined temperature is determined to be $T_B$. Similarly, for the n-type furnace for diffusing phosphorus to the n-silicon solid wafer 165, a temperature $T_P$ may be selected.

Figure 6:
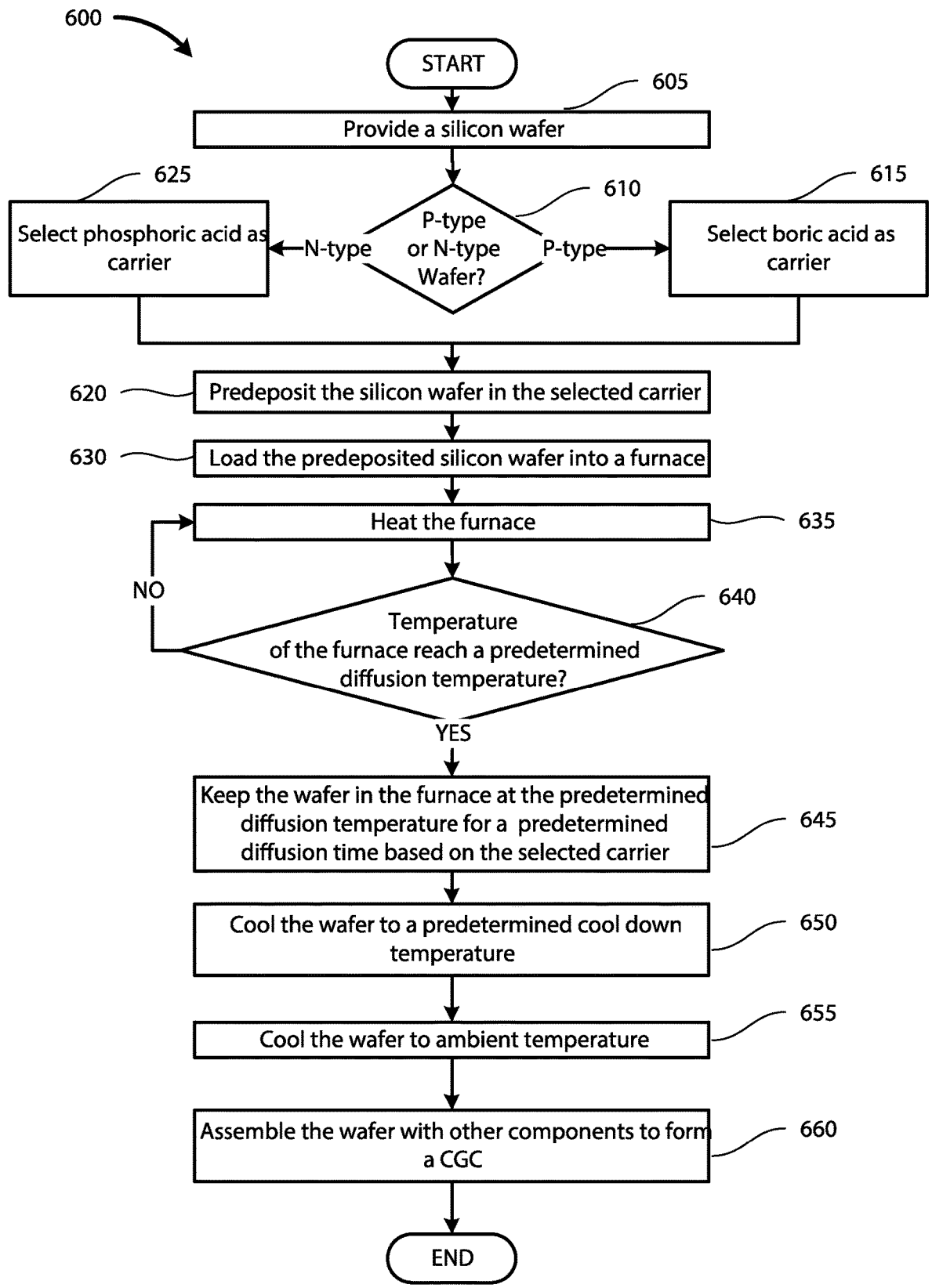
FIG. 6 is a flowchart illustrating an exemplary current generation coupon manufacturing method.

FIG. 6 is a flowchart illustrating an exemplary CGC manufacturing method 600. For example, the method 600 may be performed to produce the CGC 145. In this example, the method begins when a silicon wafer is provided in step 605. For example, the silicon wafer may be first having oxide layer removed by dipping into a Hydrofluoric acid for three minutes. Next, in a decision point 610, it is determined whether the silicon wafer is a p-type or an n-type wafer. If it is a p-type wafer, boric acid is selected as carrier in step 615. In step 620, the wafer is predeposited in the selected carrier. For example, the silicon wafer may be dipped into ant poison to create a first deposited layer for a p-type wafer.

If the wafer is an n-type wafer, in step 625, phosphoric acid is selected as carrier, and the step 620 is repeated. For example, phosphoric acid may be used to deposit the first carrier layer for a n-type wafer.

In step 630, the predeposited wafer is loaded into a furnace. For example, a n-type wafer may be loaded to an n-type furnace. A p-type wafer may be loaded to a p-type furnace, for example. After the wafer is loaded, the furnace is heated in step 635.

In a decision point 640, it is determined whether the temperature of the furnace reached a predetermined diffusion temperature. For example, for boron as the carrier, the predetermined temperature may be 1200° C. as described with reference to FIG. 5.

In step 645, the wafer in the furnace is kept at the predetermined diffusion temperature for a predetermined diffusion time based on the selected carrier. Next, the wafer is cooled to a predetermined cool down temperature (e.g., 500° C.) in step 650. After the wafer is cooled to a predetermined cool down temperature, the wafer is cooled to an ambient temperature in step 655. For example, a furnace door may be open at this step. In step 660, the wafer is assembled with other components to form a CGC. For example, the wafers may be diced into ¾" by ¾" dies. For example, the dies may be painted with colors to identify a type (n-type or p-type). For example, the n-type die and the p-type die may be bonded together with the cold metal fin 150 and the hot metal fin 160 to form a CGC 145.

In some implementations, a high-temperature tolerant epoxy (e.g., a silver epoxy) may be applied to the surface of the CGC (e.g., to bond a fin to the CGC). For example, the high temperature tolerant epoxy may withstand a temperature of more than 480° C. By way of example and not limitation, some implementation may use LOCTITE ABLESTIK (available from Henkel Corporation, Culver City, CA).

Figure 7:
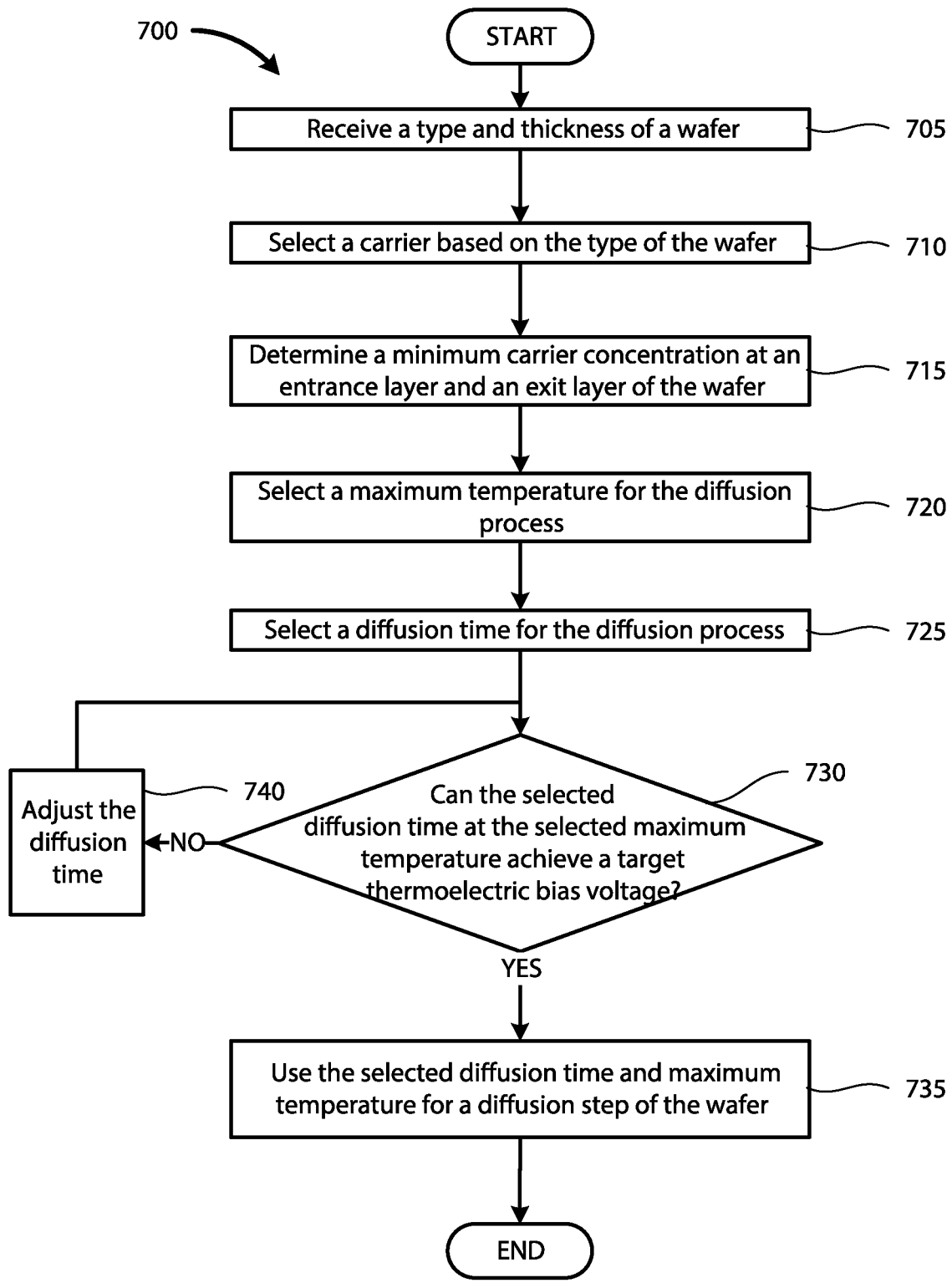
FIG. 7 is a flowchart illustrating an exemplary method for selecting parameters for manufacturing a forward bias regulated semiconductor.

FIG. 7 is a flowchart illustrating an exemplary method 700 for selecting parameters for manufacturing a forward bias regulated semiconductor. For example, the parameters may be set based on at least partially the solid solubility of a selected carrier as described with reference to FIG. 5.

The method 700 begins when a type and thickness of a wafer is received in step 705. For example, a type and thickness of a silicon wafer is provided. Next, in step 710, a carrier based on the type of the wafer is selected. For example, boron is selected for a p-type wafer. For example, phosphorus is selected for an n-type wafer.

In step 715, a minimum carrier concentration at a forward layer and an entrance layer of the wafer is determined. For example, the minimum carrier concentration may be determined based on empirical experimental results of the selected carrier. A maximum temperature (e.g., $T_1$ as described with reference to FIG. 5) for the diffusion process is selected in step 720. Next, in step 725, a diffusion time for the diffusion process is selected.

In a decision point 730, it is determined whether the selected diffusion time at the selected maximum temperature can achieve a target thermoelectric bias voltage. For example, the target thermoelectric bias voltage may be determined by historical data. If it is determined that the selected diffusion time at the selected maximum temperature can achieve a target thermoelectric bias voltage, in step 735, the selected diffusion time and maximum temperature for a diffusion step of the wafer is used, and the method 700 ends.

If it is determined that the selected diffusion time at the selected maximum temperature cannot achieve a target thermoelectric bias voltage, in step 740, the selected diffusion time is adjusted and the decision point 730 is repeated.

In some implementations, a wafer (e.g., a silicon wafer) may be de-oxidized prior to diffusion. For example, a silicon wafer may be de-oxidized using acid (e.g., acid-dipped) to remove silicon-oxide prior to diffusion. For example, hydrofluoric acid may be used (e.g., 8-10% concentrate diluted 10 parts deionized water to 1 part acid solution) to acid-dip the silicon wafer.

Figure 8:
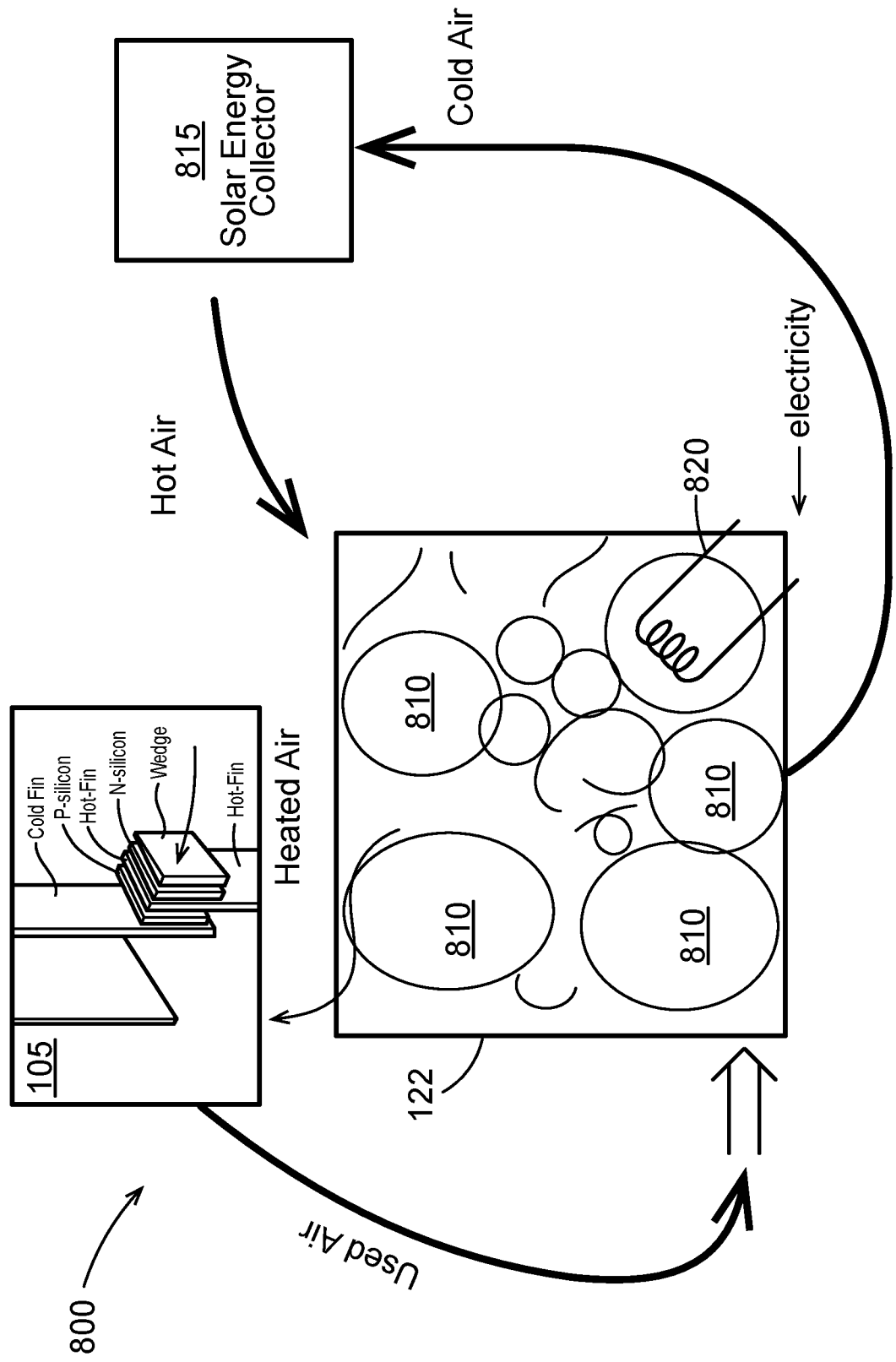
FIG. 8 depicts an exemplary thermal energy storage system (TESS) in an illustrative use-case scenario.

FIG. 8 depicts an exemplary solar energy transportation system (SETS) in an illustrative use-case scenario. In this example, a SETS 800 includes a SSG 105. The SSG 105 is operably coupled to a solid state generation store (SSGS 122). The SSGS 122 includes gen-stones 810. For example, the SSGS 122 may be 70% filled with multiple of the gen-stones 810. For example, the SSGS 122 may be 75% filled with multiple of the gen-stones 810. For example, the SSGS 122 may be 85% filled with multiple of of the gen-stones 810. The gen-stones 810 may include insulated hot bauxite alumina. In some embodiments, the SETS 800 may be a 14-foot on sea structure the gen-stones 810 to supply two or more SSGs 105. For example, the SETS 800 may supply 2MW-month selectively supplied to a power grid.

In some implementations, the gen-stones 810 may, for example, be graded by size. For example, the gen-stones 810 may include a distribution of volumes (e.g., pea-sized, golf-ball sized). For example, the gen-stones 810 may have a limited amount of dust (e.g., less than 1%, less than 5%, less than 10%). For example, the distribution of volumes and/or the maximum permitted amount of dust (e.g., by volume) may be selected to achieve a percentage fill of a volume. For example, the gen-stones 810 may be selected and mixed with varying sizes (e.g., maximum outer radius, individual volume) to achieve a predetermined percentage fill by volume (e.g., of the SSGS 122, as discussed above). The gen-stones 810 may, for example, be selected and/or spatially distributed such that voids (e.g., air gaps) are spatially distributed throughout the gen-stone-filled volume of the SSGS 122. In some implementations, for example, the fill may be selected such that a flow rate (e.g., volume per unit time) of fluid (e.g., air, water) through the voids may be driven by a pressure not to exceed a predetermined maximum driving pressure. In some implementations, by way of example and not limitation, the predetermined maximum driving pressure may be 20.7 kPa (kilopascals) (3 pounds per square inch).

As shown in this example, the SSGS 122 is coupled to a solar energy collector 815. For example, the solar energy collector 815 may supply hot air to heat the gen-stones 810. For example, the gen-stones 810 may store the thermal energy received. In this example, the SSGS 122 may circulate cooled air back to the solar energy collector 815 to be reheated.

In this example, the SSGS 122 also includes a hi-nickel heater 820. The hi-nickel heater 820 may be powered by an external electricity supply. For example, the external electricity supply may be generated by wind power. In some implementations, the SETS 800 may use excess electricity generated by the SSG 105 to power the hi-nickel heater 820 and may use the gen-stones 810 (e.g., alumina bauxite) for heat storage for future electricity generation. In some implementations, the SSGS 122 may be heated using methane burned from a low pressure gas well. As shown, the SSGS 122 may circulate heated air through the CGC 145 of the SSG 105. For example, the used air may be exhausted back to the SSGS 122 for reheating.

In some embodiments, the SETS 800 may be distributed at locations along a power grid to be ready for quick switching to supply supplementary power to the power grid. For example, during times with less electricity demand (e.g., at 12 am-6 am), the SETS 800 may store the excess power in the SSGS 122. For example, in peak demand times, the SETS 800 may inject supplementary power to the power grid. In some implementations, the SETS 800 may include a control system to automatically control and transport the SSGS 122 from one location to another based on power demand forecast.

In some examples, in a three-phased power system, power at a top and a bottom of each phase are not delivered to customers. In some implementations, the SETS 800 may extract the undelivered power and store the extracted energy in the SSGS 122. For example, 10% of power at the top and 10% of power at the bottom of each phase may be captured. In some implementations, when power demand is high, the SETS 800 may convert the stored power to the market to meet the excess power demand. For example, the SETS 800 may advantageously balance power supply and demand to reduce costs.

Figure 9:
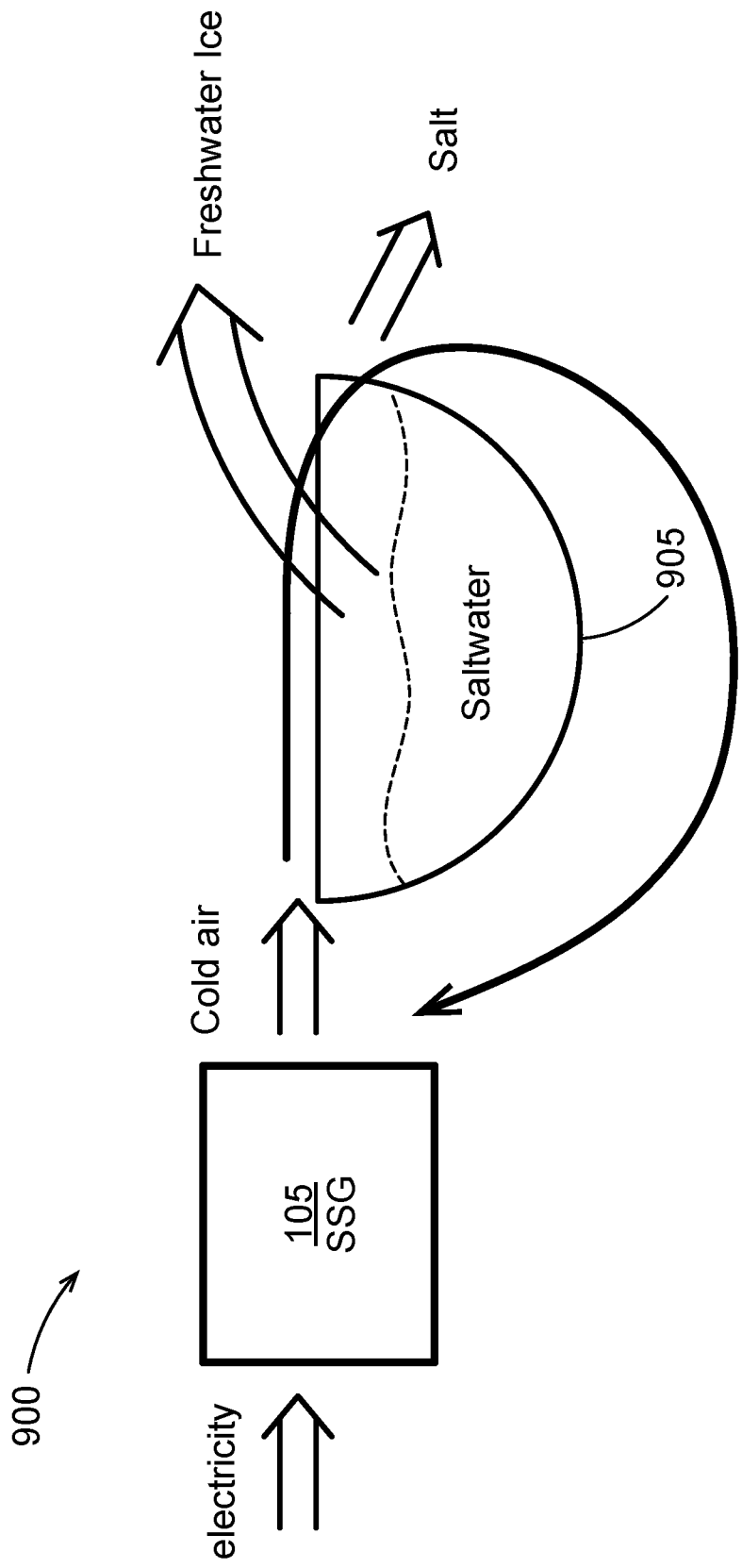
FIG. 9 depicts an exemplary freshwater production system (FPS) in an illustrative use-case scenario.

FIG. 9 depicts an exemplary freshwater production system (FPS 900) in an illustrative use-case scenario. In this example, the FPS 900 includes the SSG 105. For example, the SSG 105 may generate cold air when an electric current is supplied through the TESR 125. As shown, the generated cold air may be supplied to a reservoir 905 of salt water (e.g., sea water). For example, the salt water may be frozen by the cold air. In some examples, salt residue on the freshwater ice may be rinsed off so that the freshwater ice may be extracted. Various embodiments and applications of the FPS 900 are described with reference to FIGS. 33-35 of Inventor's previously filed U.S. patent application Ser. No. 11/517,882, titled "Thermoelectric device with make-before-break high frequency converter," filed by Jon Murray Schroeder, et al., on Sep. 8, 2006, issued as U.S. Pat. No. 8,183,456. The foregoing application is entirely incorporated herein by reference. For example, the freshwater ice may be melted to use the melted water for irrigation.

Figure 10:
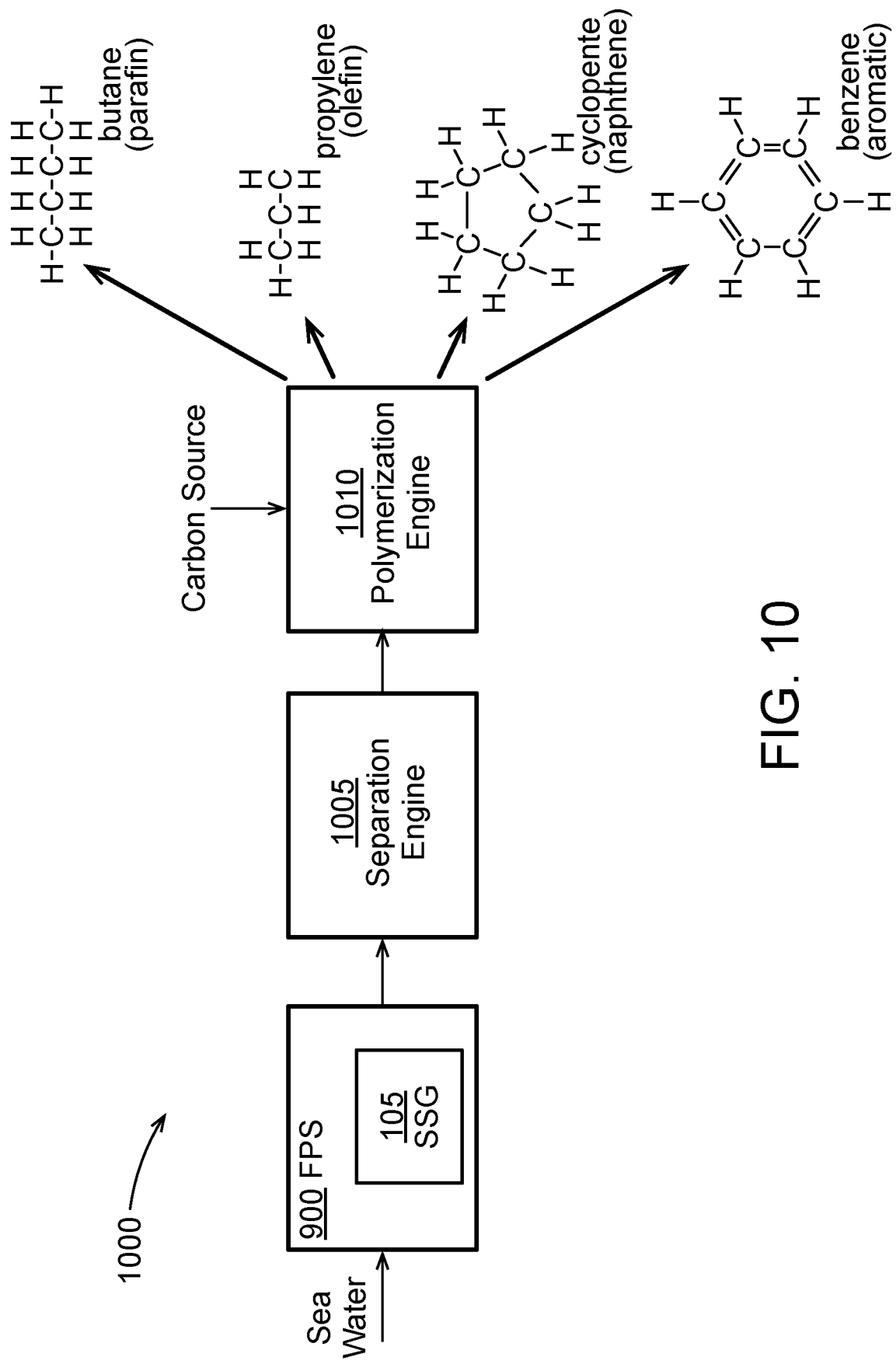
FIG. 10 depicts an exemplary carbon neutral fuel synthesizing system (CNFSS) in an illustrative use-case scenario.

FIG. 10 depicts an exemplary carbon neutral fuel synthesizing system (CNFSS 1000) in an illustrative use-case scenario. In this example, the CNFSS 1000 includes the FPS 900 to receive sea water input. As discussed above, the FPS 900 includes a SSG 105 to generate freshwater. The CNFSS 1000 includes a separation engine 1005. In this example, the separation engine 1005 receives the freshwater to produce hydrogen to supply a polymerization engine 1010.

The polymerization engine 1010 receives also a carbon source to generate various hydrocarbon compounds. For example, the polymerization engine 1010 may produce butane, olefin, benzene, cyclopentane. In some examples, the generated hydrocarbon compounds may be used to produce jet fuel.

Although various embodiments have been described with reference to the figures, other embodiments are possible.

For example, in some implementations, a cluster of generator systems (e.g., including SSGs 105) may be clustered together. At least one SSG 105 of the cluster may be selected as a control generator. The other SSGs 105 may be configured (e.g., operably coupled) to the control SSG such that they operate in synchrony with the control SSG. For example, the control SSG may be operated (e.g., turned on, turned off, electrically coupled to a power grid, decoupled from a power grid, output frequency adjusted, output phase adjusted, output amplitude adjusted) and the other SSGs in the cluster may automatically adjust likewise. For example, in some implementations, a generation network may be deployed and advantageously operated as a single unit (e.g., remotely, programmatically, manually).

In some implementations, for example, a power grid 115 may be a regional power grid. In some examples, the power grid 115 may be a local (e.g., building wide, campus wide) power grid.

In some examples, the power grid 115 may be a single load. For example, the power grid 115 may operate at 50 and/or 60 Hz. The power grid 115 may, for example, operate at a predetermined voltage(s) (e.g., 120V, 240V, 408V, 480V, 2400V, multiple kV). A grid ready module (e.g., grid ready module 110) may, for example, convert an output of a SSG (e.g., SSG 105) to a corresponding voltage, frequency, and/or phase (e.g., single phase, three-phase). As an illustrative example, three phase energy may be output through three transformers to a power grid. Each leg may, by way of example and not limitation, be output from the grid ready module(s) at 440V and/or up to 800 A (as an illustrative example). In this illustrative example, 440V×3 phase×800 A=1,056,000 W. Accordingly, for example, an SSG-based system may be configured to generate 1 MW of power. The output may be electrically coupled and/or grounded in a target delivery configuration (e.g., wye, delta).

In some implementations an SSGS (e.g., SSGS 122) and/or SSG (e.g., SSG 105) may be portable. For example, a portable generator (e.g., SSGS+SSG) may be configured to be mounted on a vehicle. The vehicle may, for example, be powered (e.g., electrically) by the SSGS releasing thermal energy to the SSG. The SSG may be electrically coupled, for example, to a prime mover of the vehicle (e.g., electric motor driving wheels, pneumatics, and/or hydraulics). The SSGS may, for example, be replaced periodically (e.g., at predetermined 'swap stations') for a 'charged' SSGS (e.g., a heated SSGS), such as after being depleted (e.g., thermal heat transferred across an SSG to generate electricity). The SSGS may, for example, be interchanged alone and/or with the SSG (e.g., as a single unit). Accordingly, energy may advantageously be stored and/or transported as thermal energy and converted on-demand to electrical energy.

Although an exemplary system has been described with reference to FIGS. 8-10, other implementations may be deployed in other industrial, scientific, medical, commercial, and/or residential applications. In some implementations, the SETS 800 may be moved by air cargo. For example, the Armed Forces may transport the SETS 800 to generate electricity on the battlefield. In some implementations, the SETS 800 may be used on the moon to generate electricity for space stations using solar and wind power stored in the SSGS 122. For example, the SETS 800 may be configured to power vehicles, railroads, airplanes, and other transportation vehicles. In some implementations, the SETS 800 may be used to power cities and/or regions with loss of power due to, for example, natural disasters.

Some systems may be implemented as a computer system that can be used with various implementations. For example, various implementations may include digital circuitry, analog circuitry, computer hardware, firmware, software, or combinations thereof. Apparatus can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Various embodiments can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and CD-ROM and DVD-ROM disks. The processor and the memory can be supplemented by, or incorporated in, ASICs (application-specific integrated circuits).

Various examples of modules may be implemented using circuitry, including various electronic hardware. By way of example and not limitation, the hardware may include transistors, resistors, capacitors, switches, integrated circuits, other modules, or some combination thereof. In various examples, the modules may include analog logic, digital logic, discrete components, traces and/or memory circuits fabricated on a silicon substrate including various integrated circuits (e.g., FPGAs, ASICs), or some combination thereof. In some embodiments, the module(s) may involve execution of preprogrammed instructions, software executed by a processor, or some combination thereof. For example, various modules may involve both hardware and software.

In an illustrative aspect, a thermoelectric device may, for example, include a differential temperature supply. The thermoelectric device may, for example, include a thermoelectric generator ring configured to generate an electric current based on a differential temperature received from the differential temperature supply. The thermoelectric generator ring may, for example, include multiple thermoelectric coupons forming a ring on a plane. Each of the plurality of thermoelectric coupons may, for example, include an n-type impurity diffused silicon semiconductor (IDSS) and a p-type IDSS. Impurities may, for example, be distributed in the n–type IDSS and the p-type IDSS at one or more predetermined concentration distributions. The predetermined concentration distribution may, for example, include a substrate region disposed between a first region and a second region, wherein the first region and the second region each comprise a corresponding minimum concentration of the impurities and the substrate region comprises a maximum concentration of the impurities lower than either of the minimum concentrations of the impurities, such that a forward bias voltage of the IDSS is below a predetermined target voltage. The predetermined target voltage may, for example, be less than 20 mV. In a current generation mode, a temperature differential may, for example, be applied by the differential temperature to each of the thermoelectric coupons in a forward direction such that a low-voltage loss high electric current is generated.

The p-type IDSS and the n-type IDSS may, for example, be produced by diffusing a selected impurities at the first region and the second region of a silicon semiconductor wafer. In a predeposition step, the impurities may, for example, be first introduced into two opposite surfaces of the silicon semiconductor wafer such that the impurities are deposited on the surfaces. In a diffusion step, the silicon semiconductor wafer may, for example, be placed in a diffusion furnace at a predetermined temperature for a predetermined diffusion time based on the impurities such that the impurities are diffused towards the substrate of the silicon semiconductor wafer at a predetermined depth to achieve the predetermined concentration distribution.

The selected impurities for the p-type IDSS may, for example, include boron, such that the p-type IDSS may, for example, include a p+-p junction in the first region and a p-p+ junction in the second region. The selected impurities for the n-type IDSS may, for example, include phosphorus, such that the n-type IDSS may, for example, include a n+-n junction in the first region and a n-n+ junction in the second region.

Each of the thermoelectric coupons may, for example, include hot metal fin. In a proximal end, the hot metal fin may, for example, be coupled between the second region of the p-type IDSS and the first region of the n-type IDSS. In a distal end, the hot metal fin may, for example, be operably coupled to a high temperature source of the differential temperature supply. A ratio of a contact surface area of IDSS and the hot metal fin to a width of the IDSS may, for example, be high, such that current induction efficiency is increased.

The two opposite surfaces may, for example, include an entry side and an exit side. Each of the thermoelectric coupons may, for example, include a cold metal fin coupled between the exit side of the n-type IDSS and the entry side of the p-type IDSS. In the current generation mode, the hot metal fin may, for example, conduct a high temperature from the differential temperature source such that a temperature differential is generated between the hot metal fin and the cold metal fin, wherein a high electric current is induced between the entry side of the p-type IDSS and exit side of the n-type IDSS at each of the thermoelectric coupons of the thermoelectric generator ring.

The thermoelectric device may, for example, include a housing enclosing the thermoelectric generator ring. The hot metal fin and the cold metal fin may, for example, each extend orthogonal to the horizontal plane of the thermoelectric generator ring. The hot metal fin and the cold metal fin may, for example, each extend in a direction 180° opposite to each other.

The thermoelectric device may, for example, include a high frequency power switch configured to alternately short the thermoelectric generator ring at a high frequency to generate a switching power. The thermoelectric device may, for example, include a high frequency transformer configured to transform the switching power from a low voltage power to a high voltage power as a function of a primary coil to a secondary coil ratio. The thermoelectric device may, for example, include a pulse-width-modulated rectifier operably coupled to a power output of the high frequency transformer, configured to rectify the power output into a DC voltage pulse-width modulated into an AC voltage compatible with a power grid in voltage, frequency, and phase.

The differential temperature supply may, for example, include a plurality of high temperature heat-insulated bauxite alumina units.

In a temperature differential mode, an electric power may, for example, be supplied to the thermoelectric generator ring such that a temperature differential is generated at the temperature differential supply.

In an illustrative aspect, a thermoelectric device may, for example, include a differential temperature supply. The thermoelectric device may, for example, include a thermoelectric generator ring configured to generate an electric current based on a differential temperature received from the differential temperature supply. The thermoelectric generator ring may, for example, include multiple thermoelectric coupons forming a ring on a plane. Each of the thermoelectric coupons may, for example, include a p-type impurity diffused silicon semiconductors (IDSS) and an n-type IDSS operably coupled in series, wherein impurities are distributed in each of the IDSS at a predetermined concentration distribution, such that a forward bias voltage of the IDSS is below a predetermined target voltage. The predetermined voltage may, for example, be less than 20 mV. In a current generation mode, a temperature differential may, for example, be applied by the differential temperature to each of the thermoelectric coupons in a forward direction such that a low-voltage loss high electric current is generated.

The predetermined concentration distribution may, for example, include a substrate disposed between a first region and a second region. The first region and the second region may, for example, include a minimum concentration of the impurity such that the forward bias voltage of the IDSS is substantially reduced.

The IDSS may, for example, be produced by diffusing a selected impurities at the first region and the second region of a silicon semiconductor wafer. In a predeposition step, the impurities may, for example, be first introduced into two opposite surfaces of the silicon semiconductor wafer such that the impurities are deposited on the surfaces. In a diffusion step, the silicon semiconductor wafer may, for example, be placed in a diffusion furnace at a predetermined temperature for a predetermined diffusion time based on the impurities such that the impurities are diffused towards the substrate of the silicon semiconductor wafer at a predetermined depth to achieve the predetermined concentration distribution. The predetermined temperature may, for example, be 1200° C. The predetermined diffusion time may, for example, be 10 minutes.

The selected impurities for the p-type IDSS may, for example, include boron, such that the p-type IDSS may, for example, include a p+-p junction in the first region and a p-p+ junction in the second region. The selected impurities for the n-type IDSS may, for example, include phosphorus, such that the n-type IDSS may, for example, include a n+-n junction in the first region and a n-n+ junction in the second region.

The two opposite surfaces may, for example, include an entry side and an exit side. Each of the thermoelectric coupons may, for example, include a hot metal fin. In a proximal end, the hot metal fin may, for example, be coupled between the exit side of the p-type IDSS and the entry side of the n-type IDSS. In a distal end, the hot metal fin is operably thermally coupled to a high temperature source of the differential temperature supply. A ratio of a contact surface area of IDSS and the hot metal fin to a width of the IDSS is greater than 1, such that current induction efficiency is increased.

Each of the thermoelectric coupons may, for example, include a cold metal fin coupled between the exit side of the n-type IDSS and the entry side of the p-type IDSS. In the current generation mode, the hot metal fin may, for example, conduct a high temperature from the differential temperature source such that a temperature differential is generated between the hot metal fin and the cold metal fin. A high electric current may, for example, be induced between the entry side of the p-type IDSS and exit side of the n-type IDSS at each of the thermoelectric coupons of the thermoelectric generator ring.

The thermoelectric device may, for example, include a housing enclosing the thermoelectric generator ring. The hot metal fin and the cold metal fin may, for example, each extend orthogonal to the horizontal plane of the thermoelectric generator ring. The hot metal fin and the cold metal fin may, for example, each extend in a direction 180° opposite to each other.

The thermoelectric device may, for example, include a high frequency power switch configured to alternately short the thermoelectric generator ring at a high frequency to generate a switching power. The thermoelectric device may, for example, include a high frequency transformer configured to transform the switching power from a low voltage power to a high voltage power as a function of a primary coil to a secondary coil ratio. The thermoelectric device may, for example, include a pulse-width-modulated rectifier operably coupled to a power output of the high frequency transformer, configured to rectify the power output into a DC voltage pulse-width modulated into an AC voltage compatible with a power grid in voltage, frequency, and phase.

The differential temperature supply may, for example, include a container at least partially filled with mixed-volume high temperature heat-insulated bauxite alumina heatsinks having voids spatially distributed between the bauxite alumina heatsinks.

In an illustrative aspect, a method for making a thermoelectric split ring may, for example, include provide a silicon semiconductor wafer. The method may, for example, include select an n– type impurities for n-type wafer, and a p-type impurities for a p-type wafer. The method may, for example, include predeposit the silicon semiconductor wafer in the selected impurities. The method may, for example, include load the predeposited silicon wafer into a diffusion furnace. The method may, for example, include increase a temperature in the furnace to a predetermined temperature based on the selected impurities. The method may, for example, include maintain the silicon wafer at the predetermined temperature for a predetermine diffusion time. The selected impurities may, for example, be diffused in the silicon wafer at a required minimum impurity concentration distribution such that a forward bias voltage of the impurities diffused silicon wafer is reduced below a predetermined voltage threshold. The method may, for example, include assemble an n-type impurities diffused silicon wafer, a p-type impurities diffused silicon wafer, a cold metal fin, and a hot metal fin to produce a current generation coupon. The method may, for example, include couple multiple of the current generation coupons in a ring shape, wherein both ends of the ring are coupled to a high frequency power switch.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A thermoelectric device comprising:
   a differential temperature supply and a thermoelectric generator ring, wherein:
   the thermoelectric generator ring comprises a plurality of thermoelectric coupons forming a ring on a plane, and, each of the plurality of thermoelectric coupons comprises an n-type impurity diffused silicon semiconductor (IDSS) and a p-type IDSS, wherein each of the n-type IDSS and the p-type IDSS comprises: impurities diffused at opposing surfaces of a silicon semiconductor wafer at a predetermined concentration distribution, wherein the predetermined concentration distribution comprises a higher concentration of the impurities at the opposing surfaces of the corresponding IDSS than a C concentration of the impurities in a center of a thickness of the corresponding IDSS; and,
   a forward bias voltage less than 20 mV,
   wherein:
   the ring is configured such that at least one of the opposing surfaces of the n-type IDSS and the p-type IDSS of each of the plurality of thermoelectric coupons are electrically coupled to corresponding surfaces of each adjacent thermoelectric coupon of the plurality of thermoelectric coupons such that,
   in a current generation mode, a differential temperature is applied by the differential temperature supply to the plurality of thermoelectric coupons in a forward direction such that current is generated.

2. The thermoelectric device of claim 1, wherein the impurities comprise selected impurities, and the p-type IDSS and the n-type IDSS are produced by diffusing the selected impurities at the opposing surfaces of the silicon semiconductor wafer, wherein:
   in a predeposition step, the selected impurities are introduced into the opposing surfaces of the silicon semiconductor wafer such that the selected impurities are deposited on the opposing surfaces, and,
   in a diffusion step, the silicon semiconductor wafer is placed in a diffusion furnace at a predetermined temperature for a predetermined diffusion time based on the selected impurities such that the selected impurities are diffused towards a substrate of the silicon semiconductor wafer at a predetermined depth to achieve the predetermined concentration distribution.

3. The thermoelectric device of claim 2, wherein:
   the selected impurities for the p-type IDSS comprise boron, such that the p-type IDSS comprises a p+-p junction in a first region comprising a first surface of the opposing surfaces and a p-p+ junction in a second region comprising a second surface of the opposing surfaces, and,
   the selected impurities for the n-type IDSS comprises phosphorus, such that the n-type IDSS comprises a n+-n junction in the first region and a n-n+ junction in the second region.

4. The thermoelectric device of claim 3, wherein each of the plurality of thermoelectric coupons further comprises a hot metal fin wherein:
   in a proximal end, the hot metal fin is coupled between the second region of the p-type IDSS and the first region of the n-type IDSS and,
   in a distal end, the hot metal fin is operably coupled to a high temperature source of the differential temperature supply, wherein:
   a ratio of a contact surface area of an IDSS of one of the p-type IDSS and the n-type IDSS and the hot metal fin to a width of the IDSS is higher than 1, such that current induction efficiency is increased.

5. The thermoelectric device of claim 4, wherein:
   the opposing surfaces comprise an entry side and an exit side, and,
   each of the plurality of thermoelectric coupons further comprises a cold metal fin coupled between the exit side of the n-type IDSS and the entry side of the p-type IDSS, wherein:
   in the current generation mode, the hot metal fin conducts a temperature higher than an ambient temperature from the differential temperature supply such that the differential temperature is generated between the hot metal fin and the cold metal fin, wherein a steady-state electric current is induced between the entry side of the p-type IDSS and the exit side of the n-type IDSS at each of the plurality of thermoelectric coupons of the thermoelectric generator ring.

6. The thermoelectric device of claim 5, further comprising a housing enclosing the thermoelectric generator ring, wherein the hot metal fin and the cold metal fin each extends orthogonal to a horizontal plane of the thermoelectric generator ring, and the hot metal fin and the cold metal fin each extends in a direction 180° opposite to each other.

7. The thermoelectric device of claim 1, further comprising:
a high frequency power switch configured to short the thermoelectric generator ring at a frequency above a predetermined threshold to generate a switching power;
a high frequency transformer configured to transform the switching power from a first voltage to a second voltage higher than the first voltage as a function of a primary coil to a secondary coil ratio; and,
a pulse-width-modulated rectifier operably coupled to a power output of the high frequency transformer, configured to rectify the power output into an AC voltage compatible to a power grid in voltage, frequency, and phase.

8. The thermoelectric device of claim 1, wherein the differential temperature supply comprises heat-insulated bauxite alumina units heated to provide a source of thermal energy.

9. The thermoelectric device of claim 1, wherein, in a temperature differential mode, an electric power is supplied to the thermoelectric generator ring such that a temperature differential is generated at the differential temperature supply.

10. A thermoelectric device comprising:
a differential temperature supply and a thermoelectric generator ring, wherein:—
the thermoelectric generator ring comprises a plurality of thermoelectric coupons forming a ring on a plane, and,
each of the plurality of thermoelectric coupons comprises a p-type impurity diffused silicon semiconductors (IDSS) and an n-type IDSS operably coupled in series forming the ring, wherein each of the p-type IDSS and the n-type IDSS comprises:
impurities distributed at opposing surfaces of a silicon semiconductor wafer, wherein the impurities are distributed at a higher concentration at the opposing surfaces of the corresponding IDSS than at a center of a thickness of the corresponding IDSS; and,
a forward bias voltage less than 20 mV,
wherein,
the ring is configured such that at least one of the opposing surfaces of the n-type IDSS and the p-type IDSS of each of the plurality of thermoelectric coupons are electrically coupled to corresponding surfaces of each adjacent thermoelectric coupon of the plurality of thermoelectric coupons such that,
in a current generation mode, a differential temperature is applied by the differential temperature supply to the plurality of thermoelectric coupons in a forward direction such that a current is generated.

11. The thermoelectric device of claim 10, wherein the impurities comprise selected impurities, and the IDSS is produced by diffusing the selected impurities at the opposing surfaces of the silicon semiconductor wafer, wherein:
in a predeposition step, the selected impurities are introduced into two opposing surfaces of the silicon semiconductor wafer such that the selected impurities are deposited on the opposing surfaces, and,
in a diffusion step, the silicon semiconductor wafer is placed in a diffusion furnace at a predetermined temperature for a predetermined diffusion time based on the selected impurities such that the selected impurities are diffused towards a substrate of the silicon semiconductor wafer at a predetermined depth to achieve a predetermined impurity concentration distribution.

12. The thermoelectric device of claim 11, wherein the predetermined temperature comprises 1200° C. and the predetermined diffusion time comprises 10 minutes.

13. The thermoelectric device of claim 11, wherein:
the selected impurities for the p-type IDSS comprise boron, such that the p-type IDSS comprises a p+-p junction in a first region comprising a first surface of the opposing surfaces and a p-p+ junction in a second region comprising a second surface of the opposing surfaces, and,
the selected impurities for the n-type IDSS comprise phosphorus, such that the n-type IDSS comprises a n+-n junction in the first region and a n-n+ junction in the second region.

14. The thermoelectric device of claim 13, wherein the two opposing surfaces comprise an entry side and an exit side, and each of the plurality of thermoelectric coupons further comprises a hot metal fin wherein:
in a proximal end, the hot metal fin is coupled between the exit side of the p-type IDSS and the entry side of the n-type IDSS; and,
in a distal end, the hot metal fin is operably thermally coupled to a high temperature source of the differential temperature supply, wherein:
a ratio of a contact surface area of an IDSS of one of the p-type C IDSS and the n-type IDSS and the hot metal fin to a width of the IDSS is higher than 1, such that current induction efficiency is increased.

15. The thermoelectric device of claim 14, wherein each of the plurality of thermoelectric coupons further comprises a cold metal fin coupled between the exit side of the n-type IDSS and the entry side of the p-type IDSS, wherein:
in the current generation mode, the hot metal fin conducts a temperature higher than an ambient temperature from the differential temperature supply such that the differential temperature is generated between the hot metal fin and the cold metal fin, wherein a steady-state electric current is induced between the entry side of the p-type IDSS and the exit side of the n-type IDSS at each of the plurality of thermoelectric coupons of the thermoelectric generator ring.

16. The thermoelectric device of claim 15, further comprising a housing enclosing the thermoelectric generator ring, wherein the hot metal fin and the cold metal fin each extends orthogonal to a horizontal plane of the thermoelectric generator ring, and the hot metal fin and the cold metal fin each extends in a direction 180° opposite to each other.

17. The thermoelectric device of claim 10, further comprising:
a high frequency power switch configured to short the thermoelectric generator ring at a frequency above a predetermined threshold to generate a switching power;
a high frequency transformer configured to transform the switching power from a first voltage to a second voltage higher than the first voltage as a function of a primary coil to a secondary coil ratio; and, a pulse-width-modulated rectifier operably coupled to a power output of the high frequency transformer, configured to rectify the power output into a DC voltage pulse-width modulated into an AC voltage compatible with a power grid in voltage, frequency, and phase.

18. The thermoelectric device of claim 10, wherein the differential temperature supply comprises a container at least partially filled with a predetermined distribution of volume of heat-insulated bauxite alumina heatsinks heated to provide a source of thermal energy having voids spatially distributed between the bauxite alumina heatsinks.

* * * * *